US012720760B2

(12) United States Patent
Dutta et al.

(10) Patent No.: US 12,720,760 B2
(45) Date of Patent: Aug. 25, 2026

(54) FERROELECTRIC CAPACITOR WITHIN BACKSIDE INTERCONNECT

(71) Applicant: Intel Corporation, Santa Clara, CA (US)

(72) Inventors: Sourav Dutta, Hillsboro, OR (US); Nazila Haratipour, Portland, OR (US); Uygar E. Avci, Portland, OR (US); Vachan Kumar, Hillsboro, OR (US); Christopher M. Neumann, Portland, OR (US); Shriram Shivaraman, Hillsboro, OR (US); Sou-Chi Chang, Portland, OR (US); Brian S. Doyle, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 110 days.

(21) Appl. No.: 17/937,043

(22) Filed: Sep. 30, 2022

(65) Prior Publication Data

US 2024/0114694 A1 Apr. 4, 2024

(51) Int. Cl.
*H10B 53/30* (2023.01)

(52) U.S. Cl.
CPC .................................... *H10B 53/30* (2023.02)

(58) Field of Classification Search
CPC ................................ H10B 53/30; H10D 1/682
See application file for complete search history.

(56) References Cited

U.S. PATENT DOCUMENTS

2002/0105017 A1* 8/2002 Kim ........................ H10D 1/692 257/295
2003/0058678 A1* 3/2003 Kim ........................ H10B 53/30 257/295
2004/0235245 A1* 11/2004 Summerfelt ........... H10B 53/30 438/257
2020/0091162 A1* 3/2020 Morris ................ H01L 23/5226
2020/0373312 A1* 11/2020 Sharma .................... G11C 7/18
2022/0139911 A1 5/2022 Wei et al.
(Continued)

OTHER PUBLICATIONS

Wai Kit Siu, et al., “A Current-Based Reference-Generation Scheme for 1T-1C Ferroelectric Random-Access Memories,” IEEE Journal of Solid-State Circuits, vol. 38, No. 3. (Mar. 2033). pp. 541-549.

*Primary Examiner* — S M Sohel Imtiaz
(74) *Attorney, Agent, or Firm* — Arcane Law PLLC

(57) ABSTRACT

Backside integrated circuit capacitor structures. In an example, a capacitor structure includes a layer of ferroelectric material between first and second electrodes. The first electrode can be connected to a transistor terminal by a backside contact that extends downward from a bottom surface of the transistor terminal to the first electrode. The transistor terminal can be, for instance, a source or drain region, and the backside contact can be self-aligned with the source or drain region. The second electrode can be connected to a backside interconnect feature. In some cases, the capacitor has a height that extends through at least one backside interconnect layer. In some cases, the capacitor is a multi-plate capacitor in which the second conductor is one of a plurality of plate line conductors arranged in a staircase structure. The capacitor structure may be, for example, part of a non-volatile memory device or the cache of a processor.

20 Claims, 37 Drawing Sheets

(56) References Cited

U.S. PATENT DOCUMENTS

2022/0310638 A1* 9/2022 Cheng ................ H10D 30/6735
2022/0392907 A1* 12/2022 Manipatruni .......... H10D 1/716
2024/0298452 A1* 9/2024 Hu ......................... H10B 53/30

* cited by examiner 116
121
121
119
119
117
117
Etch Stop
118
Alternate Configuration:
116
119
121
117
114
115
Dielectric 114
115
114
103
103
103
113
113
109
105
107
109
105
107
109
LI
BL
Dielectric
112

FERROELECTRIC CAPACITOR WITHIN BACKSIDE INTERCONNECT

FIELD OF THE DISCLOSURE

The present disclosure relates to integrated circuits, and more particularly, to non-volatile memory structures.

BACKGROUND

As integrated circuits continue to scale downward in size, a number of challenges arise. For instance, reducing the size of memory and logic cells is becoming increasingly more difficult, as is reducing device spacing at the device layer. As transistors are packed more densely, the formation of memory structures for storing information becomes challenging. Accordingly, there remain a number of non-trivial challenges with respect to forming semiconductor devices.

Figure 1:
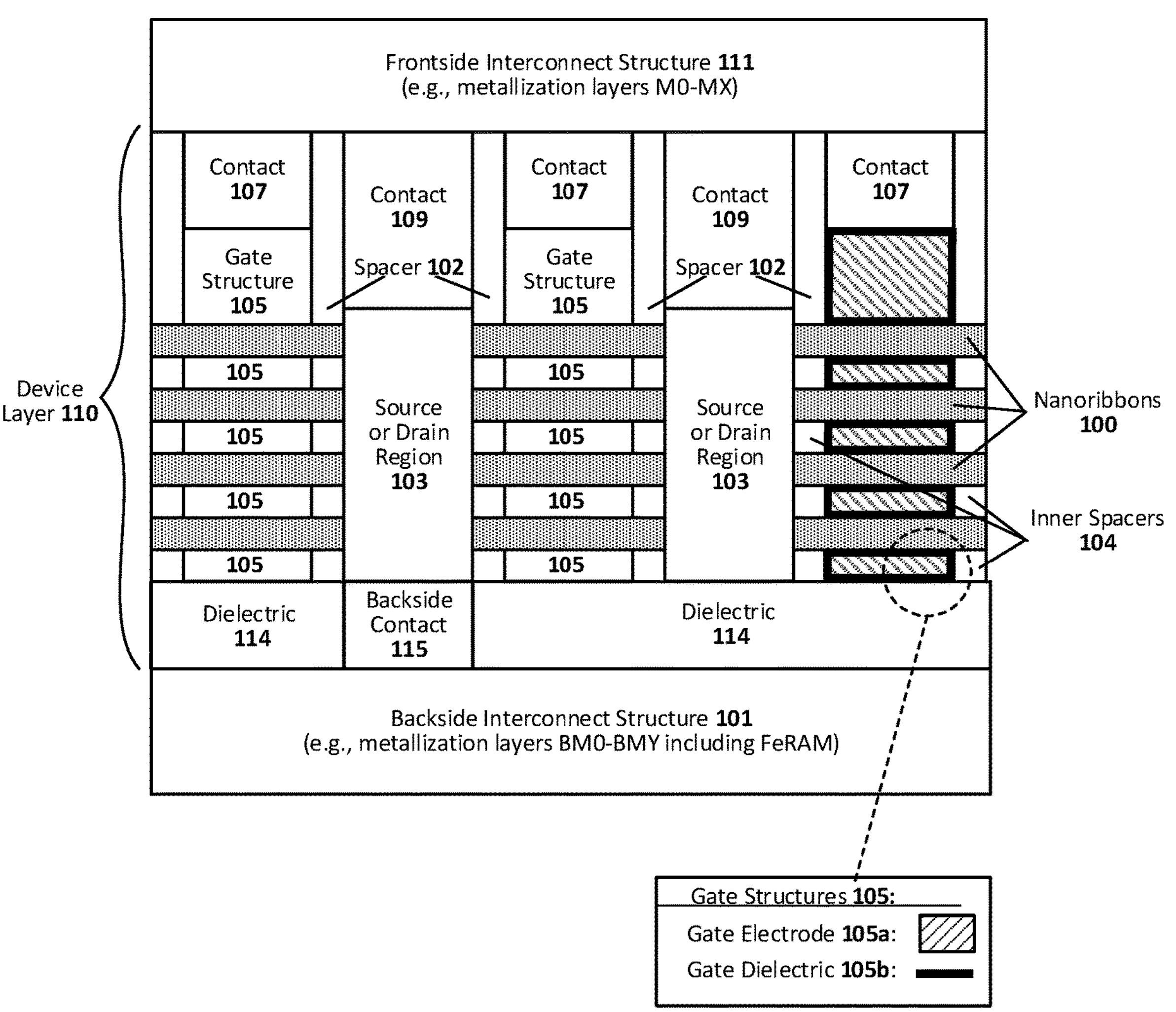
FIG. 1 shows a general cross-sectional view of an integrated circuit including a backside memory structure implemented with ferroelectric capacitors, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., tapered sidewalls and rounded corners), and some features may have surface topology or otherwise be non-smooth, given real world limitations of the processing equipment and techniques used.

DETAILED DESCRIPTION

Backside integrated circuit capacitor structures are disclosed. The capacitors are particularly useful in non-volatile memory applications, but may be used in other applications as well (e.g., filtering). In an example, a capacitor structure includes a ferroelectric layer between first and second electrodes. The first electrode can be connected to a transistor terminal by a backside contact. The transistor terminal can be, for instance, a source or drain region of the transistor. The backside contact extends downward from a bottom surface of the transistor terminal to the first electrode. In some cases, the backside contact is self-aligned with the source or drain region of the transistor. The second electrode can be connected to an interconnect feature in an interconnect layer. The interconnect layer can be, for instance, below the capacitor structure, or may include at least part of the capacitor structure. In some cases, the capacitor structure has a height that extends through at least one interconnect layer, or up to two interconnect layers, or more. In some cases, the capacitor is a multi-plate capacitor in which the second conductor is one of a plurality of plate line conductors arranged in a staircase-like structure. The integrated circuit capacitor structure may be, for example, part of a non-volatile memory device or the cache of a processor.

General Overview

As noted above, there remain a number of non-trivial challenges with respect to forming semiconductor devices. For example, a bitcell of a non-volatile ferroelectric random access memory (FeRAM) usually includes a capacitor (for storing of a logical bit 1 or 0) and an access transistor (for providing access to capacitor during read and write operations). The storage capacitor is integrated in the backend process of the frontside of the semiconductor die (generally referred to as back-end-of-line or BEOL processing), over the device layer that includes frontend access transistors. Unfortunately, such storage capacitors can be relatively tall (to provide sufficient capacitance), and thus occupy multiple interconnect layers with relatively scaled dimensions and tight pitch. Because the routing or interconnect connection from a frontend access transistor to the capacitor occurs through intermediate lower interconnect features (e.g., conductive lines and via) on the frontside, the ultimate scalability of the bitcell is limited to about 3× the line-pitch of first interconnect layer in one direction and about 2× the gate-pitch in the other direction. Also, with backend interconnect features having relatively scaled dimensions and tight pitch, it is difficult to further scale the bitcell to include a multi-capacitor structure, which thus limits storage density.

Thus, techniques are provided herein that integrate ferroelectric capacitors in the backside interconnect structure. The capacitors are suitable for use in the bitcells of non-volatile memory, but can be used in other applications as well. In some examples, the techniques use a backside conductive contact to connect the backside capacitor(s) to a terminal of a frontend access transistor, thus reducing frontside routing overhead. The dimensions of interconnect features (e.g., conductive lines and vias) in the backside interconnect can be primarily designed for power signals, and thus may have relaxed dimensions and pitch, relative to frontside interconnect features proximate the device layer. This relaxation helps reduce process complexity of fabricating a bitcell capacitor in the backside where the capacitor can be wider and may primarily occupy, for example, only one or two interconnect layers. Also, because the capacitor is integrated in the backside and can be connected directly to the frontend access transistor using a backside contact, the bitcell can be further scaled. Also, the relaxed dimensions and pitches for the backside conductive interconnects allows for relatively tall capacitors with multiple laterally extending plate line connections, which in turn allows building a multi-capacitor bitcell (1T-xF) using a staircase structure such as used in 3D NAND flash memories, with x being the number of lateral plate lines or capacitors), thus significantly increasing memory density. The techniques can be readily extended to various bitcell configurations, such as a 2T-xF bitcell.

An example includes an integrated circuit that includes a frontside interconnect structure above a device layer, and a backside interconnect structure below the device layer. The device layer includes a transistor, such as a bitcell access transistor. The frontside interconnect structure includes a conductive interconnect feature (e.g., metal via and/or line) connected to a first terminal of the transistor. The backside interconnect structure includes a ferroelectric capacitor connected to a second terminal of the transistor. In some such examples, the second terminal of the transistor includes a backside contact that is below and in contact with a source or drain region of the transistor, and an electrode of the ferroelectric capacitor is in contact with the backside contact. In some such cases, the backside contact can be self-aligned with the source or drain region which it is below. The transistor and capacitor may be, for example, part of a bitcell of a non-volatile memory.

Another example includes an integrated circuit memory cell (also called a bitcell) that includes an access transistor and a storage capacitor. The access transistor includes a body of semiconductor material (e.g., fin or one or more nanoribbons) extending from a source region to a drain region, and a backside contact extending downward from a bottom surface of the source or drain region. A gate structure may be provided over the semiconductor material between the source and drain regions. The capacitor includes a ferroelectric material layer between first and second electrodes. The backside contact is on the first electrode, and the second electrode is in contact with a backside interconnect feature (e.g., conductive via and/or line). In some cases, the capacitor has a height that extends at least one interconnect layer (the vertical distance between first and second etch stops delineating first and second interconnect layers of the overall backside interconnect structure).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of a backside ferroelectric capacitor structure (e.g., by way of a TEM cross-section image) at least partially within the first interconnect layer of the backend interconnect structure and connected to a terminal of a device layer transistor by way of a backside contact. The backside contact may be self-aligned to the transistor terminal, such as the source or drain region, and thus its sidewalls may be co-linear with sidewalls of a trench or recess in which the terminal (e.g., source or drain region) at least partially resides.

Materials that are compositionally distinct or different as used herein refers to two materials that have different chemical compositions. This compositional difference may be, for instance, by virtue of an element that is in one material but not the other (e.g., silicon germanium is compositionally different than silicon), or by way of one material having all the same elements as a second material but at least one of those elements is intentionally provided at a different concentration in one material relative to the other material (e.g., silicon germanium having 70 atomic percent germanium is compositionally different than from silicon germanium having 25 atomic percent germanium). In addition to such chemical composition diversity, the materials may also have distinct dopants (e.g., boron, silicon, gallium, and magnesium) or the same dopants but at differing concentrations. In still other embodiments, compositionally different may further refer to two materials that have different crystallographic orientations. For instance, (110) silicon is different from (100) silicon. Creating a stack of different orientations could be accomplished, for instance, with blanket wafer layer transfer. If two materials are elementally distinct or different, then one of the material has an element that is not in the other material.

As used herein, the term layer refers to a material portion including a region with a thickness. A monolayer is a layer that consists of a single layer of atoms of a given material. A layer can extend over the entirety of an underlying or overlying structure, and may have an extent less than the extent of an underlying or overlying structure. A layer can extend horizontally, vertically, and/or along a tapered or non-linear surface. A layer can be conformal to a given surface (whether flat or curvilinear) with a relatively uniform thickness across the entire layer, but need not be conformal or otherwise uniform. A single layer may have a graded component or multiple phases, such that the layer is not homogenous.

Architecture

FIG. 1 shows a general cross-sectional view of an integrated circuit including a backside memory structure implemented with ferroelectric capacitors, in accordance with an embodiment of the present disclosure. As shown, the integrated circuit includes a device layer 110 having a backside interconnect structure 101 on its backside, and a frontside interconnect structure 111 on its frontside. The device layer 110 includes a number of transistor devices (e.g., gate-all-around transistors, in this example). Each of the backside interconnect structure 101 and frontside interconnect structure 111 can have many configurations and may generally include any number of interconnect layers. A given interconnect layer generally includes an interlayer dielectric material (e.g., silicon dioxide) having conductive features (e.g., vias and conductive runs) formed therein to facilitate signal and power routing for a given integrated circuit, and can be separated from a previous interconnect layer or device layer by an etch stop (e.g., nitride, oxynitride, oxycarbonitride). In any such cases, the backside interconnect structure 101 includes one or more ferroelectric capacitors, which in some examples are storage elements of a non-volatile memory application (e.g., FeRAM). Further example details of the backside interconnect structure 101 and frontside interconnect structure 111 are described with reference to FIGS. 2*a* through 8*j*.

As can be seen, the cross-section is taken parallel to, and through, the channel structure, such that transistor channel, source, and drain regions are shown. The configuration of the device layer 110 can vary from one example to the next, so other embodiments may have a device layer that is configured differently. This particular cross-section includes three channel regions along with a source region and a drain region 103, but any number of channel regions and corresponding source and drain regions can be included. Other examples may not have channel regions to each side, such as the example case where only the middle channel region is present (and the left and right channel regions are not present). Similarly, all transistor terminals in this example are contacted, but other examples may include dummy devices or devices that are not connected into the overall circuit.

A given transistor device generally includes a semiconductor region 100 (sometimes called a channel region) that extends between a source region 103 and a drain region 103, and a gate structure 105 on the semiconductor region 100. In this example, each semiconductor region 100 between respective source and drain regions 103 is in the form of four nanoribbons, and the respective gate structure 105 wraps around the nanoribbons to provide a gate-all-around (GAA) configuration. Other such examples may have fewer or more nanoribbons, or one or more nanowires (e.g., taller and less wide than nanoribbons). Still other examples may have nanosheets (e.g., forksheet device) or a fin structure (e.g., finFET) for a given semiconductor region 100, and the respective gate structure 105 is on multiple surfaces of a given nanosheet or the fin structure. The semiconductor regions 100 may include any number of semiconductor materials, such as silicon, germanium, silicon germanium (SiGe), or a group III-V semiconductor material (e.g., gallium arsenide), and may be doped or undoped, and may be shaped or sculpted during the gate formation process, according to some embodiments. In some cases, semiconductor regions 100 may be a multilayer structure, such as a SiGe body cladded with germanium, or a silicon body cladded with SiGe. Any suitable forming methodologies may be used to provide a device layer 110 configured with any number of transistor configurations, such as finFETs, gate-all-around transistors, or forksheet transistors.

Each of gate structures 105 can be formed, for example, via gate-first or gate-last processing, and may include any number of suitable gate materials and configurations. In some such embodiments, each of gate structures 105 includes a gate electrode 105*a* and a gate dielectric 105*b* between the gate electrode 105*a* and the semiconductor region 100, as shown on the right side of FIG. 1 (the other gate structures 105 can be similarly configured). Spacers 102 and inner spacers 104 may also be considered part of the gate structures 105. Spacers 102 and 105 may be, for example, silicon nitride or silicon oxynitride or silicon oxycarbonitride. The gate dielectrics 105*b* may be any suitable gate dielectric material(s), such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out to improve gate dielectric quality when a high-k material is used. Further, the gate electrodes 105*a* may comprise a wide range of suitable conductive materials, such as aluminum, tungsten, cobalt, ruthenium, molybdenum, titanium, tantalum, copper, titanium nitride, or tantalum nitride, for example. In some examples, the gate dielectrics 105*b* and/or gate electrodes 105*a* may include a multilayer structure of two or more material layers or components. For instance, in one such example, a given gate dielectric 105*b* is a bi-layer structure having a first dielectric material (e.g., silicon dioxide or other oxide native to semiconductor region 100) wrapped around semiconductor region 100, and a second high-k dielectric material (e.g., hafnium oxide or other high-k dielectric) on the first dielectric material. Likewise, a given gate electrode 105*a* may include, for example, a central plug or fill portion (e.g., tungsten, cobalt, molybdenum, ruthenium) with one or more outer workfunction layers (e.g., titanium nitride for PMOS workfunction, or an aluminum-containing alloy such as titanium aluminum carbide for NMOS workfunction) and/or barrier layers (e.g., tantalum nitride), and/or a resistance reducing cap layer (e.g., cobalt). In the example shown, a gate contact or capping layer 107 is provided on top of (or otherwise integrated into) gate structure 105, which can be any number of conductive gate materials, such as those listed above. In some embodiments, the gate dielectric 105*b* and/or gate electrode 105*a* may include concentration grading (increasing or decreasing) of one or more materials therein. Numerous gate structure configurations can be used along with the techniques described herein.

Likewise, numerous source and drain region 103 configurations can be used. In some examples, the source and drain regions 103 are epitaxial regions that are provided after the relevant portion of the fin structure or substrate is isolated and etched away or otherwise removed. In other embodiments, the source and drain regions 103 may be doped portions of the fin structure or substrate, rather than epi regions. In some embodiments using an etch and replace process, a trench is first etched in the locations where the source and drain regions 103 will be grown. In some such cases, the trench etch process etches deeper into the subfin or underlying substrate, to make room for a backside contact placeholder (such as a deposition of silicon nitride, or other place holder material that can later be selectively etched out and replaced, such as placeholder 106 shown in FIG. 5*a*). After the backside contact placeholder is provisioned, the source and drain regions 103 can be epitaxially grown from the exposed sidewalls of the channel region, such that the source and drain regions 103 fill the source/drain trench or recess and sit on the backside contact placeholder. As further described below, the backside contact placeholder can subsequently be removed during a backside reveal and selective etch process, and replaced with a conductive contact material (e.g., tungsten) to provide backside conductive contacts 115. Note that each of the resulting contacts 115 is self-aligned to the source or drain region 103 with which it is in contact (because they are formed in the same trench or recess). Dielectric material 114 (e.g., silicon dioxide) can be used to fill areas adjacent to contacts 115.

Note that inner spacers 104 also can be formed during source and drain processing. For instance, inner spacers 104 can be formed after the source and drain trenches are etched but prior to the epitaxial growth of the source and drain regions 103, by way of a lateral etch process that recesses sacrificial channel layers (now shown) exposed in the recess and is selective to the semiconductor material 100. The resulting recesses (e.g., 2 nm to 20 nm wide) can then be filled with spacer material (e.g., silicon nitride). The other portion of the sacrificial channel layers are not shown either, as they are removed during gate processing to release the nanoribbons 100, in the example case shown in FIG. 1.

The source and drain regions 103 can be any suitable semiconductor material and may include any dopant scheme. For instance, source and drain regions 103 may be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. Source and drain regions 103 can be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In one specific embodiment, source and drain regions 103 are boron-doped SiGe, or phosphorus-doped silicon. In a more general sense, the source and drain regions 103 can be any semiconductor material suitable for a given application. In some cases, source and drain regions 103 may include a multilayer structure, such as a germanium cap on a SiGe body, or a germanium body and a carbon-containing SiGe spacer or liner between the corresponding channel region and that germanium body. In any such cases, a portion of the source and drain regions 103 may have a component that is graded in concentration, such as a graded germanium concentration to facilitate lattice matching, or a graded dopant concentration to facilitate low contact resistance. Any number of source and drain configurations can be used.

The contacts 109 and 115 can have any number of configurations. In some example embodiments, the contacts 109 and 115 include a contact conductive fill material and a conductive liner or barrier layer, deposited in a contact trench formed over (or under) the source and drain regions 103. The liner or barrier can be, for example, tantalum or tantalum nitride, and the conductive fill can be any suitable plug/core material, such as tungsten, aluminum, ruthenium, molybdenum, cobalt, titanium, copper, or alloys thereof. In some cases, the contacts 109 and 115 can be optimized p-type or n-type similar to p-type and n-type gate electrodes. For instance, according to some such embodiments, the liner can be titanium for NMOS contacts, or nickel or platinum for PMOS contacts. In still other embodiments, the contacts 109 and 115 may include resistance reducing materials (e.g., nickel, platinum, nickel platinum, cobalt, titanium, germanium, nickel, gold, or alloys thereof such as germanium-gold alloy, or a multilayer structure of titanium and titanium nitride all have good contact resistance), in addition to contact fill and any liner. Other embodiments may be configured differently. In a more general sense, any number of contact configurations and forming processes can be used.

Again, FIG. 1 is one example of a device layer with which the techniques described herein can be used. More generally, the device layer 110 can be any device layer configuration, having a given node or terminal that is accessible by a backside contact, such as a self-aligned contact 115.

Figure 2A:
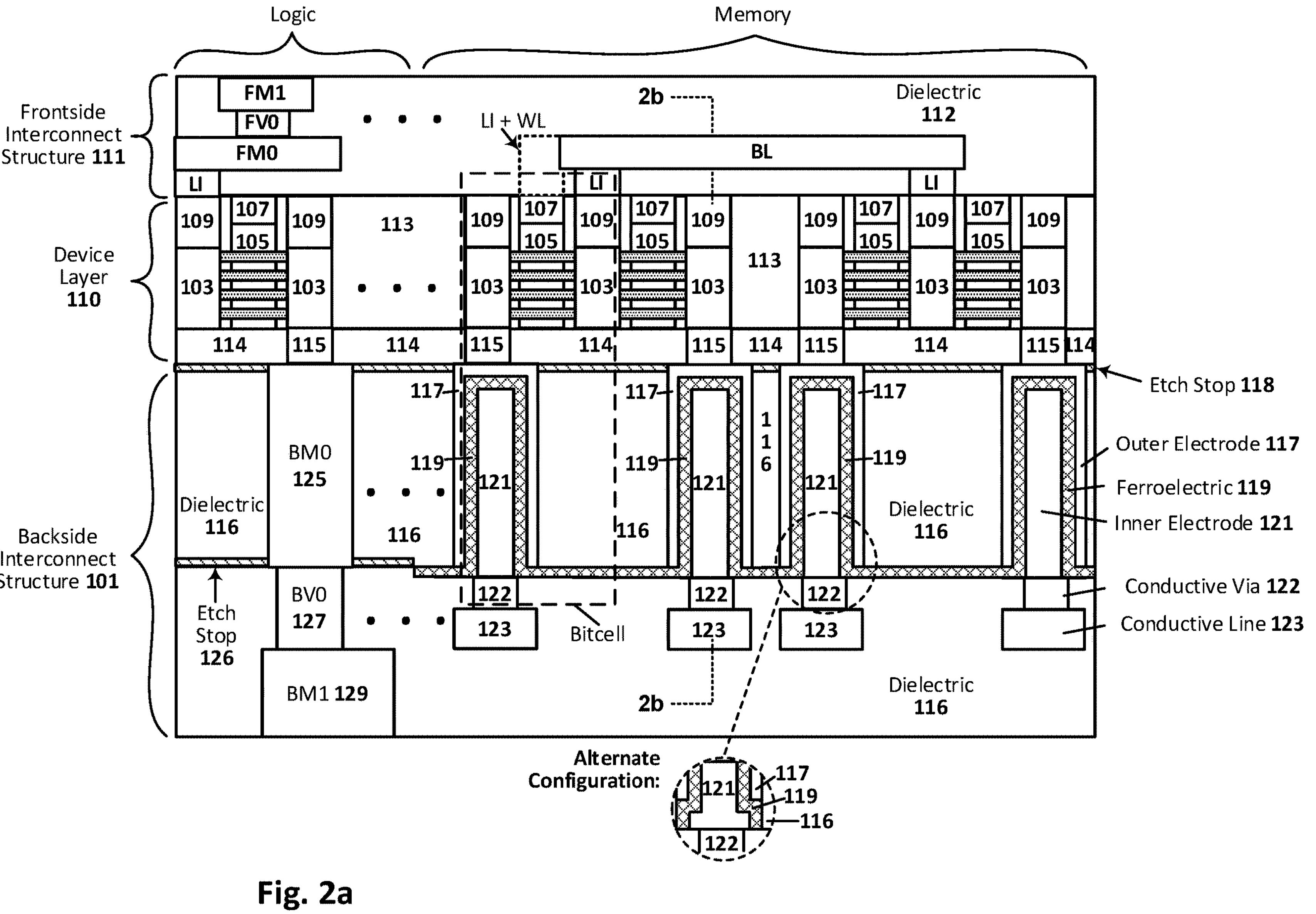
FIGS. 2*a-b* each shows a more detailed cross-sectional view of an integrated circuit including a backside memory structure implemented with ferroelectric capacitors, in accordance with some embodiments of the present disclosure.
Figure 2B:
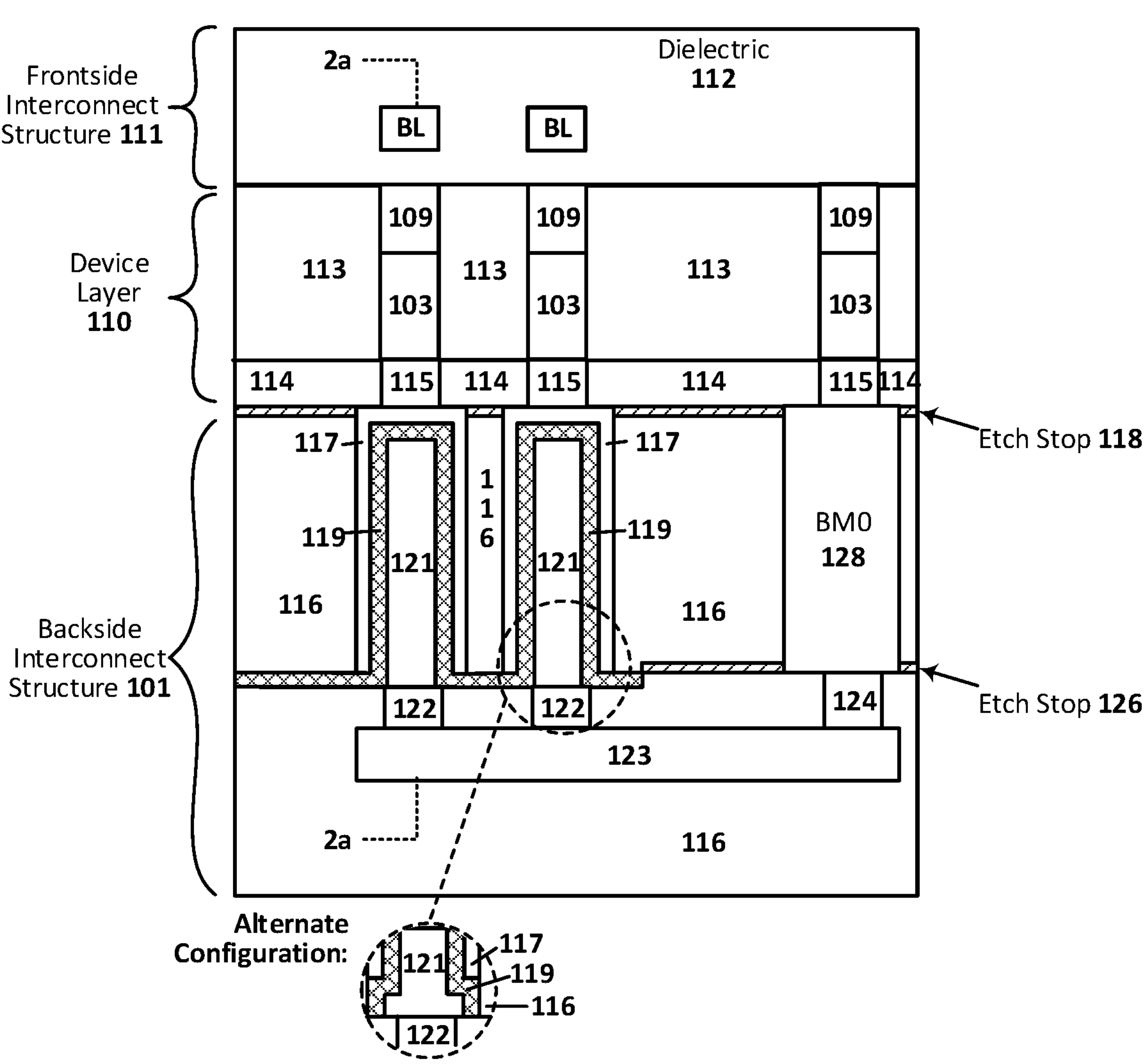

FIGS. 2*a*-*b* each shows further details of the backside interconnect structure 101 and frontside interconnect structure 111, in accordance with some embodiments of the present disclosure. The cross-section depicted in FIG. 2*b* is taken at the dashed line 2*b*-2*b* indicated in FIG. 2*a*, and the cross-section depicted in FIG. 2*a* is taken at the dashed line 2*a*-2*a* indicated in FIG. 2*b*. As further shown, the integrated circuit can include different functional sections or portions, and in this particular example includes a logic section and a memory section. Other examples may be configured differently, such as one example case that includes a hybrid section that may include both logic and memory elements, or no logic section, or some other functional combination. The ellipsis points are used to show that there may be a distance between the sections along with intervening sections and/or additional structures.

The logic section may be any logic section and may include any type of logic circuitry (e.g., computational circuits, logic gates, etc.), and does not necessarily interact with the memory section, but may depending on the application of the integrated circuit. The logic section also provides a size reference against which the height of the ferroelectric capacitor can be compared. In this example case, for instance, each of four ferroelectric capacitors (each including 117, 119, and 121) occupies roughly the same height as a backside interconnect layer (similar to height of BM0 125) used for backside power delivery on the logic side.

The memory section generally includes an array of memory bitcells. In an example case, the array is a non-volatile FeRAM array. A basic FeRAM bitcell generally includes an access transistor connected in series with a ferroelectric capacitor (also referred to as a 1T-1F bitcell), wherein the access transistor has its gate terminal coupled to the word line of the memory array, its source terminal coupled to the bit line of the memory array, and its drain terminal coupled to one electrode of a corresponding ferroelectric capacitor. The other electrode of the capacitor is coupled to a plate line of the memory array. As further described below, variations on this bitcell can be used to increase memory density (e.g., 1T-xF and 2T-xF bitcells, where x is the number of ferroelectric capacitors).

The frontside interconnect structure 111 may include one or more frontside interconnect layers (e.g., 0 through 9), and is generally configured to route logic, control, word line, and bit line signals, in this example case. Each interconnect layer may include one or more conductive interconnect features (e.g., lines and/or vias) within dielectric 112. As shown in the example of FIG. 2*a*, the first frontside interconnect layer includes conductive lines FM0 and BL, which both couple to the device layer 110 by way of a local interconnect (LI). The conductive line FM0 routes the signal from a source or drain region 109 of a transistor in the logic section to the next frontside interconnect layer for further routing.

As further shown in FIG. 2*a*, the conductive line BL is a bit line of the memory section and is coupled to the source region 109 of two different access transistors. The cross-section of FIG. 2*b* shows an additional bit line BL. Also, as shown in dashed lines but not actually visible in this cross-section of FIG. 2*a*, another local interconnect and conductive line structure (designated as LI+WL) couples the gate contact or terminal 107 of the corresponding access transistor to a word line of the memory section. This LI+WL structure would be visible in a cross-section that is behind or in front of the cross-section shown in FIG. 2*a*. A similar one or more LI+WL structures may be on each of one or more other corresponding gate terminals 107 in the memory section.

A second frontside interconnect layer of structure 111 includes a dual damascene structure within dielectric 112 that includes line FM1 and via FV0, which couples FM1 to FM0 of the first interconnect layer. Other such examples may include a single damascene structure. As previously described, there may be an etch stop (any suitable etch stop material, such as a nitride layer) between the first and second interconnect layers. The conductive lines, vias and local interconnects can be implemented with any suitable conductive materials (e.g., copper, tungsten, molybdenum, titanium, titanium nitride, tantalum, tantalum nitride, ruthenium, or doped polysilicon). The dielectric 112 can be any suitable dielectric (e.g., silicon dioxide, or low-k version thereof such as carbon-doped silicon dioxide). More generally, interconnect structure 111 can have any suitable frontside interconnect configuration.

The backside interconnect structure 101 may also include one or more backside interconnect layers (e.g., 0 through 9), and is generally configured to route power, and plate line signals, in this example case. Each interconnect layer may include one or more conductive interconnect features (e.g., lines and/or vias) within dielectric 116. Also, in this example, the memory section of the first backside interconnect layer includes a number of ferroelectric capacitors. Four capacitors are shown in this example, but other examples may include fewer or more capacitors. In this example configuration, each capacitor is coupled to a terminal of a corresponding access transistor, to provide a 1T-1F bitcell. One such example bitcell is generally indicated in FIG. 2*a* with the dashed box labelled bitcell. Note that neighboring bitcells may share a source or drain region 103, such as in this example where the bit line is coupled to a shared source region. As further shown in FIGS. 2*a-b*, each capacitor includes an outer electrode (or terminal) 117, a ferroelectric layer 119, and an inner electrode (or terminal) 121. Each of the outer electrodes 117 is in contact with a corresponding backside self-aligned contact 115 of the device layer 110. Each of the inner electrodes 121 is connected by way of a plate line via 122 to a plate line conductor 123 in the second backside interconnect layer. As shown in the cross-section of FIG. 2*b*, each of the plate line conductors 123 is in turn routed by way of a corresponding via 124 back through a conductive line BM0 128 to a backside contact 115 of another logic transistor at the end of the memory array. Note the capacitor height is comparable to the height of the conductive line BM0 128.

Further note that an etch stop 118 can be used to separate device layer 110 from the first interconnect layer (or be part of the first interconnect layer). The outer electrodes 117 pass through etch stop 118 to touch contact 115. Likewise, a second etch stop 126 can be used to separate the first interconnect layer from the second interconnect layer (or be part of one of those interconnect layers). The etch stops can be implemented with any suitable etch stop material (e.g., silicon nitride). The etch stop may include a multi-layer structure (e.g., oxide layer on a nitride layer, or vice-versa).

The conductive lines, vias and plate lines, as well as the outer and inner electrodes 117 and 121, can be implemented with any suitable conductive materials (e.g., copper, tungsten, molybdenum, titanium, titanium nitride, tantalum, tantalum nitride, ruthenium, or doped polysilicon). Any of these conductive features may include multi-layer configurations, such as a liner or barrier layer (e.g., titanium nitride liner with tungsten fill). The dielectric 116 can be any suitable interlayer dielectric (ILD) material (e.g., silicon dioxide, or a low-k version thereof such as porous silicon dioxide if structural integrity permits, or carbon-doped silicon dioxide). The ferroelectric layer 119 may be implemented with any suitable ferroelectric materials (e.g., lead titanate or PTO, lead zirconate titanate or PZT, lead lanthanum zirconate titanate or PLZT, barium titanate or BTO, hafnium oxide doped with any of silicon zirconium aluminum or scandium such as HZO, and oxides with high polarization charge density such as aluminum scandium nitride or AlScN).

As further shown in FIGS. 2*a-b*, the layer of ferroelectric material 119 extends laterally along the bottom of the first interconnect layer, in this example case. Such a configuration may be helpful in preventing shorting of the inner electrode 121 to the outer electrode 117, such as the case where alignment of underlying via 122 is off so as to inadvertently cause short between the two electrodes. In this sense, the configuration improves the process margin. In other examples that lateral portion of the layer 119 may be removed (e.g., by chemical mechanical planarization). Likewise, the etch stop 126 does not extend into the memory section in this example case or is otherwise removed during the capacitor forming process, but in other examples the etch stop 126 may be left intact, such that the inner electrodes pass through the etch stop 126 to contact their respective vias 122.

As further shown in FIG. 2*a*, an alternative configuration of the ferroelectric capacitor includes the case where the inner electrode 121 is recessed (e.g., 2 to 10 nm) prior to depositing the ferroelectric layer 119. The resulting structure is shown in the dashed circle. Notice the T-shape at the bottom of the inner electrode 121. Again, such a configuration may be helpful in preventing shorting of the inner electrode 121 to the outer electrode 117, and improve process margin. Further notice the ferroelectric layer 119 does not laterally extend along the bottom of the first interconnect layer, but it may in other example embodiments.

In such a 1T-1F configuration, the bitcell may be scaled, for instance, to 2× the pitch of the first interconnect layer conductors in one direction, and 1.5× gate-pitch in the other direction, so as to provide a 2× higher density over a conventional FeRAM design. More generally, backside interconnect structure 101 can have any suitable backside interconnect configuration, along with one or more ferroelectric capacitors integrated therein.

Figure 3A:
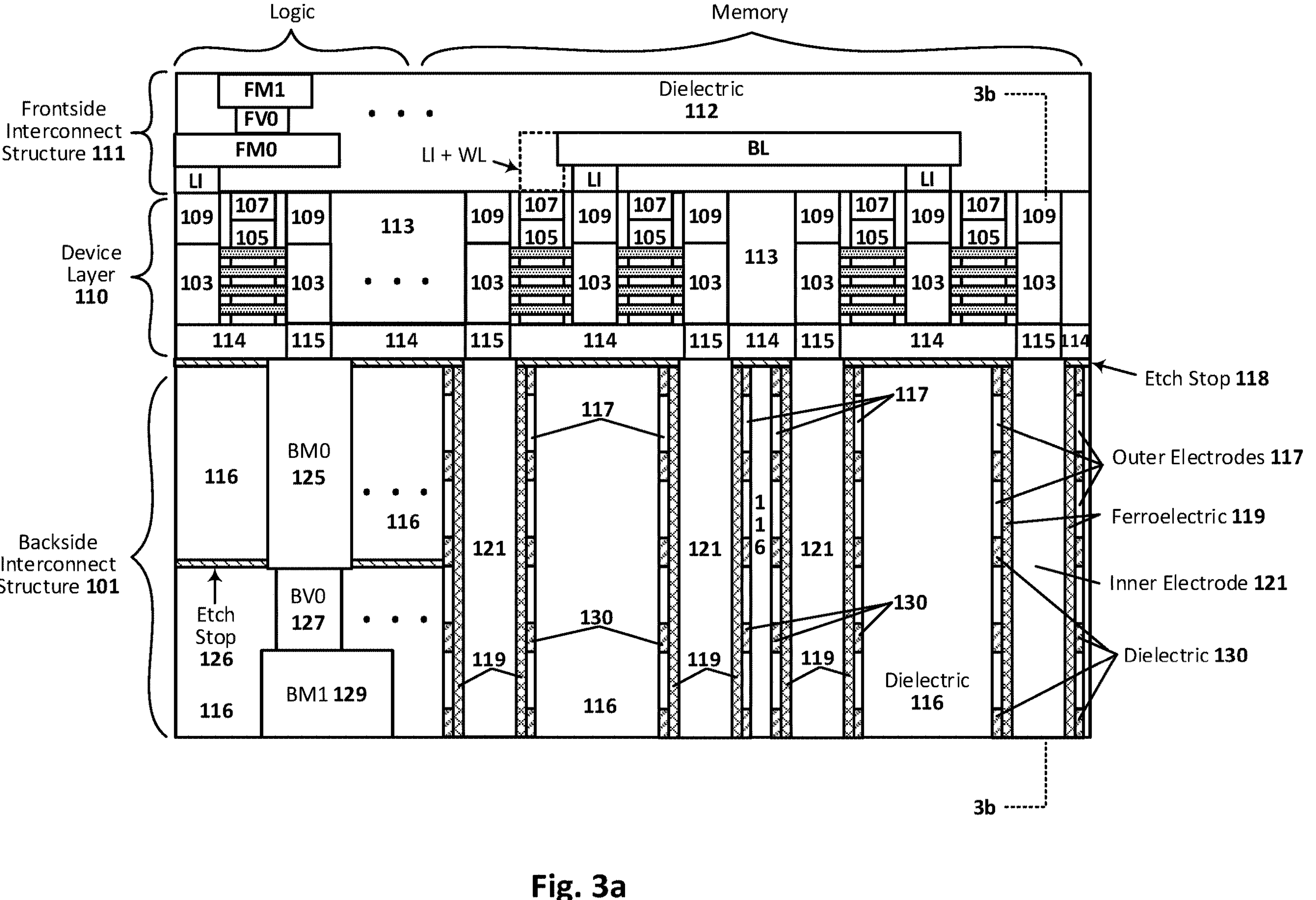
FIGS. 3*a-b* each shows a more detailed cross-sectional view of an integrated circuit including a backside memory structure implemented with ferroelectric capacitors, in accordance with some other embodiments of the present disclosure.
Figure 3B:
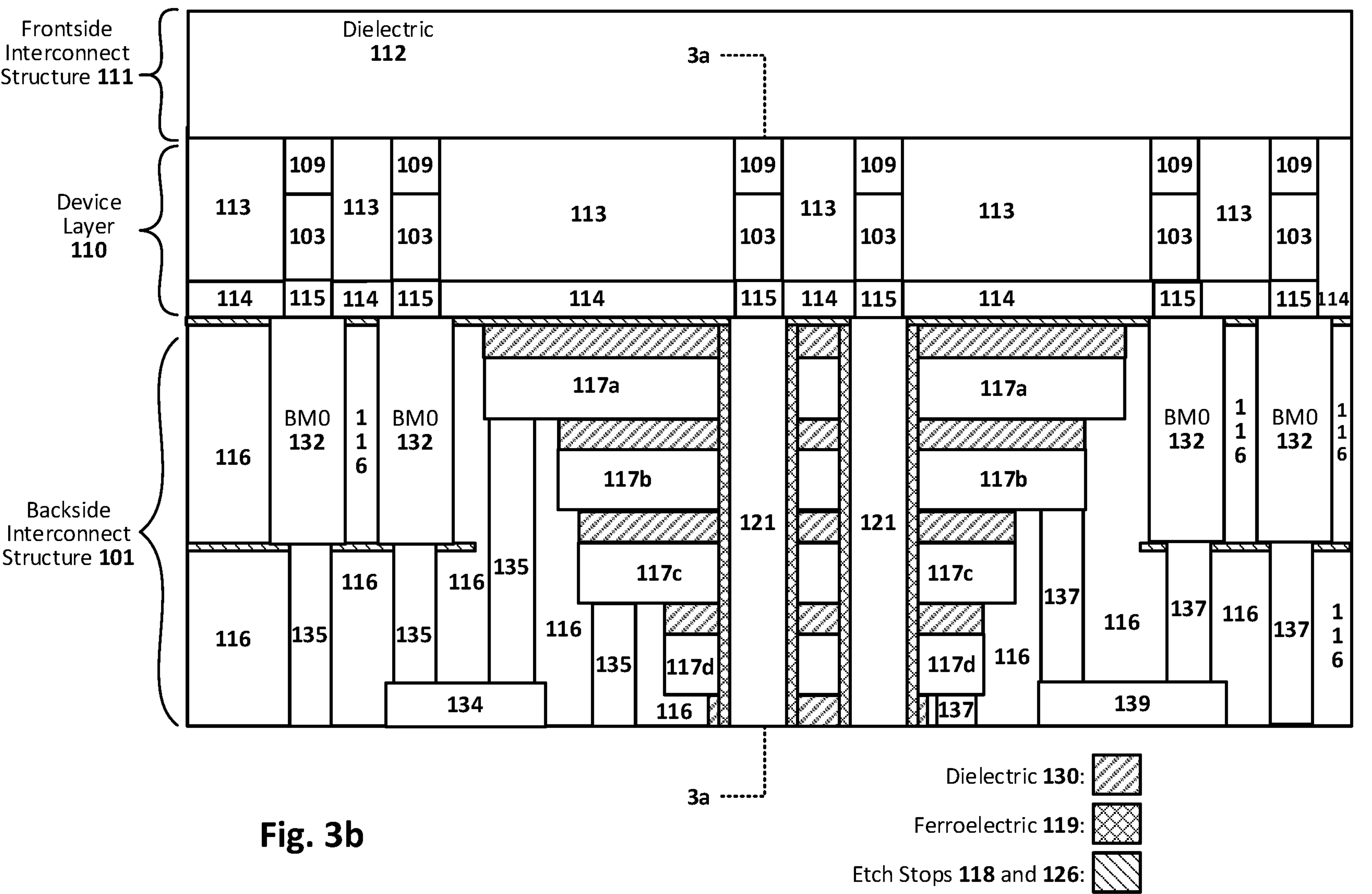

FIGS. 3*a-b* each shows a more detailed cross-sectional view of an integrated circuit including a backside memory structure implemented with ferroelectric capacitors, in accordance with some other embodiments of the present disclosure. The cross-section depicted in FIG. 3*b* is taken at the dashed line 3*b*-3*b* indicated in FIG. 3*a*, and the cross-section depicted in FIG. 3*a* is taken at the dashed line 3*a*-3*a* indicated in FIG. 3*b*. The above relevant description with respect to similarly depicted features and configurations, such as the description with respect to different functional sections or portions, as well as device layer 110 and frontside interconnect structure 111, is equally applicable here.

Like the example of FIGS. 2*a-b*, the backside interconnect structure 101 of FIGS. 3*a-b* may include one or more backside interconnect layers (e.g., 0 through 9), and is generally configured to route power, and plate line signals, in this example case. Each interconnect layer may include one or more conductive interconnect features (e.g., lines and/or vias) within dielectric 116. However, in this example, a memory section of the first and second backside interconnectnect layers includes a number of multi-plate ferroelectric capacitors, with each capacitor having a number of plates (or plate lines). Specifically, four four-plate capacitors are shown in this example, but other examples may include fewer or more multi-plate capacitors; likewise, other examples may include fewer or more plates per capacitor. In this example configuration, each four-plate capacitor is coupled to a terminal of a corresponding access transistor, to provide a 1T-4F bitcell (4 caps/cell). As further shown in FIGS. 3*a-b*, each capacitor includes four outer electrodes (or terminals) 117 (also referred to as plate lines 117 in this particular configuration), a ferroelectric layer 119, and an inner electrode (or terminal) 121. The four outer electrodes or plate lines 117 extend laterally outward from the ferroelectric layer 119 and inner electrode 121, and are separated from one another by a layer of dielectric 130 (e.g., silicon oxide, silicon nitride or silicon carbide, or a low-k version of any of these). Each of the inner electrodes 121 is in contact with a corresponding backside self-aligned contact 115 of the device layer 110. Also, as shown in FIG. 3*b*, each (or some subset) of the four outer electrodes or plate lines 117 of each four-plate capacitor can be connected to a different corresponding plate line conductor and routed back through backside interconnect conductors to a frontend logic transistor at the end of the memory array.

So, and with reference to the example depicted in FIG. 3*b*, outer electrode or plate line 117*a* is routed by conductor 135 (e.g., plate line via) to conductor 134 (e.g., plate line interconnect or line), which is coupled by way of another conductor 135 (e.g., plate line via) and BM0 132 (e.g., conductive line) to a backside contact 115 of a transistor in one location of the logic section. Similarly, outer electrode or plate line 117*b* is routed by conductor 137 (e.g., plate line via) to conductor 139 (e.g., plate line interconnect or line), which is coupled by way of another conductor 137 (e.g., plate line via) and BM0 132 (e.g., conductive line) to a backside contact 115 of another transistor in the logic section. Similarly, outer electrodes or plate lines 117*c* and 117*d* are routed by respective conductors 135 and 137 (e.g., plate line vias) to a respective destination within the integrated circuit. The word line and bit line connections can be done using frontside interconnect layers as described above with respect to the frontside interconnect structure 111. As further shown in FIG. 3*a*, the capacitor height is comparable to the collective height of BM0 125 of the first backside interconnect layer the dual damascene structure of BVO 127 and BM1 129 in the second backside interconnect layer.

Note in example of FIGS. 3*a-b* that ferroelectric layer 119 is between the inner electrode 121 and each of the outer electrodes 117, as well as between the inner electrode 121 and each of the dielectric layers 130. Further note that an etch stop 118 can be used to separate device layer 110 from the first interconnect layer (or be part of the first interconnect layer). The inner electrodes 121 pass through etch stop 118 to touch a corresponding contact 115. Likewise, a second etch stop 126 can be used to separate the first interconnect layer from the second interconnect layer (or be part of one of those interconnect layers). As further shown in FIGS. 3*a-b*, the etch stop 126 does not extend into the memory section in this example case or may be otherwise removed during the capacitor forming process. The above relative description with respect to etch stop materials and configurations is equally applicable here, as is the above discussion with respect to materials and configurations of conductive lines, vias and plate lines, outer and inner electrodes.

As further shown in the example of FIG. 3*b*, the multi-plate capacitor is implemented with a staircase structure. As shown, the staircase structure includes a number of steps each generally including a first layer of dielectric material 130, and a second layer that provides a conductive electrode or so-called plate line 117 (there are four plate lines in this example, 117*a-d*). In addition, different plate line vias 135 land on different steps of the staircase structure, as described above (e.g., one via 135 lands on the step that includes plate line 117*a*). Dielectric 116 is provided to planarize the staircase structure. Any staircase architecture and related processes can be used, such as those used in 3D NAND memory technology. As further shown in the example of FIG. 3*b*, the plate line via connections 135 and 137 are shown symmetrically distributed on left-facing and right-facing staircases, to allow relaxed pitch. In other examples, such plate line via connections 135 and 137 may all be on the same staircase with a tighter pitch, or some other configuration.

A next interconnect layer can be provided below the capacitors, such as discussed with respect to FIGS. 2*a-b*. In one example case, the a dual damascene process is used to connect to the inner electrode 121 to a conductive line (e.g., line 123) by way of a via (e.g., via 122).

In such a 1T-4F configuration, the memory density can be increased by 6× compared to a 1T-1F FeRAM bitcell. More generally, backside interconnect structure 101 can have any suitable backside interconnect configuration, along with one or more multi-plate ferroelectric capacitors integrated therein.

Figure 4A:
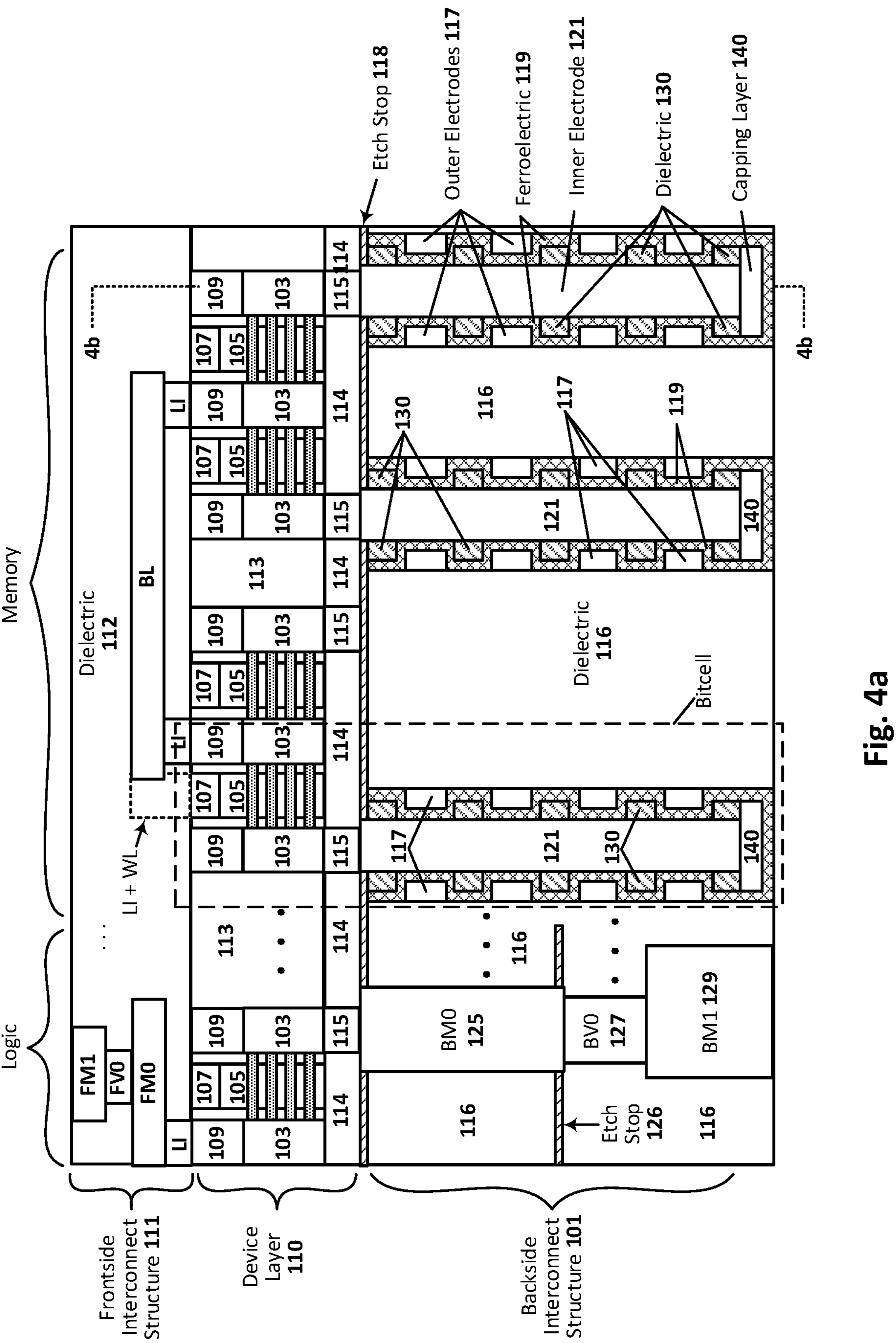
FIGS. 4*a-b* each shows a more detailed cross-sectional view of an integrated circuit including a backside memory structure implemented with ferroelectric capacitors, in accordance with still other embodiments of the present disclosure.
Figure 4B:
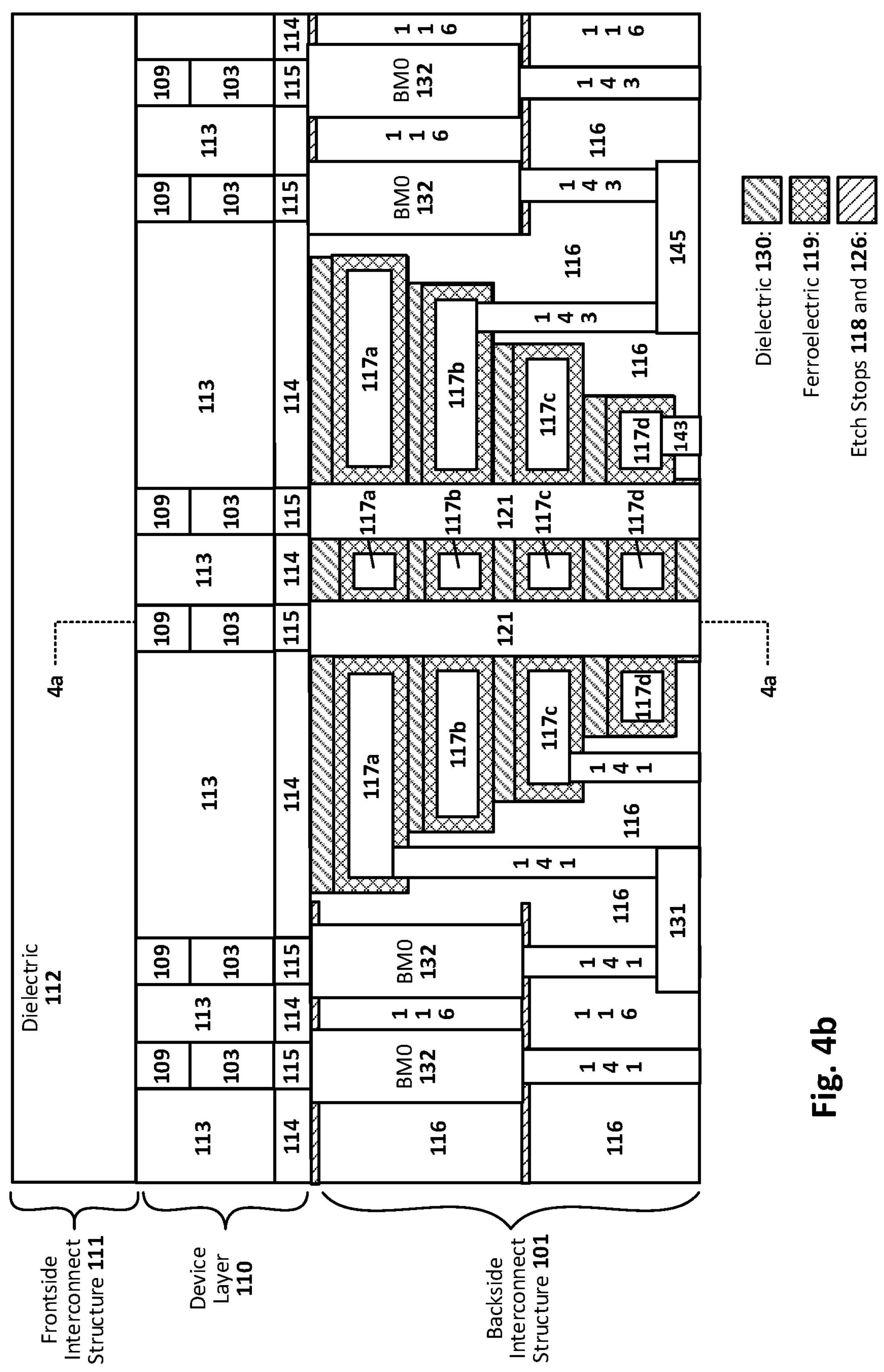

FIGS. 4*a-b* each shows a more detailed cross-sectional view of an integrated circuit including a backside memory structure implemented with ferroelectric capacitors, in accordance with still other embodiments of the present disclosure. The cross-section depicted in FIG. 4*b* is taken at the dashed line 4*b*-4*b* indicated in FIG. 4*a*, and the cross-section depicted in FIG. 4*a* is taken at the dashed line 4*a*-4*a* indicated in FIG. 4*b*. The above relevant description with respect to similarly depicted features and configurations, such as the description with respect to different functional sections or portions, as well as device layer 110 and frontside interconnect structure 111, is equally applicable here.

Like the example of FIGS. 2*a-b* and 3*a-b*, the backside interconnect structure 101 of FIGS. 4*a-b* may include one or more backside interconnect layers (e.g., 0 through 9), and is generally configured to route power, and plate line signals, in this example case. Each interconnect layer may include one or more conductive interconnect features (e.g., lines and/or vias) within dielectric 116. However, in this example, a memory section of the first and second backside interconnect layers includes a number of multi-plate ferroelectric capacitors, with each capacitor having a number of plates (or plate lines). Specifically, four four-plate capacitors are shown in this example, but other examples may include fewer or more multi-plate capacitors; likewise, other examples may include fewer or more plates per capacitor. In this example configuration, each four-plate capacitor is coupled to a terminal of a corresponding access transistor, to provide a 1T-4F bitcell (4 caps/cell). One such example bitcell is generally indicated in FIG. 4*a* with the dashed box labelled bitcell. As further shown in FIGS. 4*a-b*, each capacitor includes four outer electrodes (or terminals) 117 (also referred to as plate lines 117 in this particular example), a ferroelectric layer 119, and an inner electrode (or terminal) 121. The four outer electrodes or plate lines 117 extend laterally outward from the ferroelectric layer 119 and inner electrode 121, and are separated from one another by a layer of dielectric 130 and the ferroelectric layer 119. Each of the inner electrodes 121 is in contact with a corresponding backside self-aligned contact 115 of the device layer 110. Also, as shown in FIG. 4*b*, each (or some subset) of the four outer electrodes or plate lines 117 of each four-plate capacitor is connected to a different corresponding plate line conductor and is routed back through backside interconnect conductor to a frontend logic transistor at the end of the memory array.

So, and with reference to the example depicted in FIG. 4*b*, outer electrode or plate line 117*a* is routed by conductor 141 (e.g., plate line via) to conductor 131 (e.g., line), which is coupled by way of another conductor 141 (e.g., plate line via) and BM0 132 (e.g., conductive line) to a backside contact 115 of a transistor in one location of the logic section. Similarly, outer electrode or plate line 117*b* is routed by conductor 143 (e.g., plate line via) to conductor 145 (e.g., line), which is coupled by way of another conductor 143 (e.g., plate line via) and BM0 132 (e.g., conductive line) to a backside contact 115 of another transistor in the logic section. Similarly, outer electrodes or plate lines 117*c* and 117*d* are routed by respective conductors 141 and 143 (e.g., plate line vias) to a respective destination within the integrated circuit. The word line and bit line connections can be done using frontside interconnect layers as described above with respect to the frontside interconnect structure 111. As further shown in FIG. 4*a*, the capacitor height is comparable to the collective height of BM0 125 of the first backside interconnect layer and the dual damascene structure of BVO 127 and BM1 129 in the second backside interconnect layer.

Also shown in this example configuration of FIG. 4*a* is a capping layer 140, which acts as a hard mask during processing, as further described below with reference to FIGS. 6*a-f* (capping layer 149), FIGS. 7*a-i* (capping layer 153), and FIGS. 8*a-j* (capping layer 158). Capping layer 140 may be, for example, a layer of titanium nitride, or a relatively thick layer of silicon dioxide, or any other suitable mask material that can be used during an etch process. In other examples, the capping layer 140 can be removed after it has served its purpose (e.g., during backside planarization), such as shown in the cross-section of FIG. 4*b*. Note in removing the capping layer 140, any excess materials on its bottommost surface (such as ferroelectric layer 119, as shown in FIG. 4*a*) is also removed. Such a capping layer also may be used in the example of FIGS. 3*a-b*, and may be left intact (or not) in the final structure.

Note in example of FIGS. 4*a-b* that ferroelectric layer 119 is between the inner electrode 121 and each of the outer electrodes 117, but not between the inner electrode 121 and each of the dielectric layers 130. Rather, the ferroelectric layer 119 also extends along sides and the ends of the plate lines 117 and the dielectric layers 130, as collectively shown in FIGS. 4*a-b*. In this manner, the ferroelectric layer 119 is between plate lines 117 and dielectric layer 130, and has a corrugated-like profile, as shown in FIG. 4*a*. Further note that an etch stop 118 can be used to separate device layer 110 from the first interconnect layer (or be part of the first interconnect layer). The inner electrodes 121 pass through etch stop 118 to touch a corresponding contact 115. Likewise, a second etch stop 126 can be used to separate the first interconnect layer from the second interconnect layer (or be part of one of those interconnect layers). The above relative description with respect to etch stop materials and configurations is equally applicable here, as is the above discussion with respect to materials and configurations of conductive lines, vias and plate lines, outer and inner electrodes. As further shown in FIGS. 4*a-b*, the etch stop 126 does not extend into the memory section in this example case or may be otherwise removed during the capacitor forming process.

As further shown in the example of FIG. 4*b*, the multi-plate capacitor is implemented with a staircase structure. As shown, the staircase structure includes a number of steps each generally including first layer of dielectric material 130, and a second layer that includes a ferroelectric layer 119 and a conductive electrode or so-called plate line 117 (there are four plate lines in this example, 117*a-d*). In addition, different plate line vias 141 land on different steps of the staircase structure, as described above (e.g., one of the vias 141 lands on the step that includes plate line 117*a*). Dielectric 116 is provided to planarize (fill in) the staircase structure.

A next interconnect layer can be provided below the capacitors, such as discussed with respect to FIGS. 2*a-b*. In one example case, the a dual damascene process is used to connect to the inner electrode 121 to a conductive line (e.g., line 123) by way of a via (e.g., via 122).

In such a 1T-4F configuration, the memory density can be increased by 6× compared to a 1T-1F FeRAM bitcell. More generally, backside interconnect structure 101 can have any suitable backside interconnect configuration, along with one or more multi-plate ferroelectric capacitors integrated therein.

Methodology

FIGS. 5*a-f* are each a cross-sectional view that illustrates a stage in an example process for forming semiconductor devices that have a backside memory structure implemented with ferroelectric capacitors, in accordance with an embodiment of the present disclosure. The resulting structure may be at least in part similar to one of the structures described with reference to FIGS. 2*a-b*. The above relevant discussion with respect to similar features is equally applicable here.

Figure 5A:
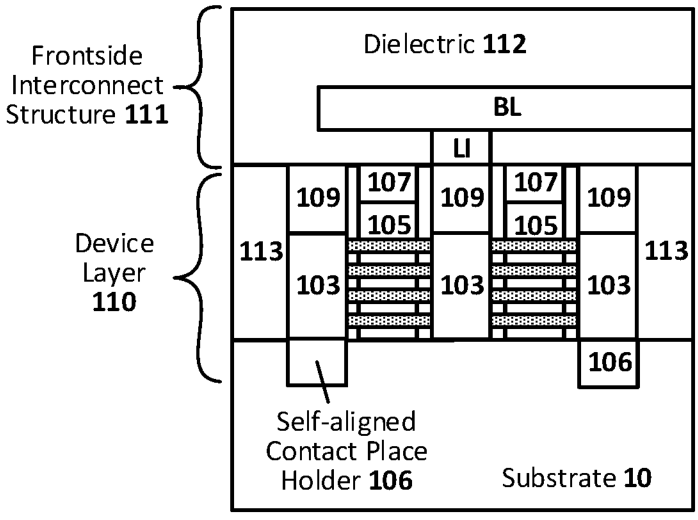
FIGS. 5*a-f* are each a cross-sectional view that illustrates a stage in an example process for forming semiconductor devices that have a backside memory structure implemented with ferroelectric capacitors, in accordance with an embodiment of the present disclosure.

FIG. 5*a* shows an example of the resulting structure after the device layer 110 and frontside interconnect structure 111 have been formed over a substrate 10. The above relevant description with respect to the device layer 110 and frontside interconnect structure 111 is equally applicable here. As further shown, substrate 10 includes self-aligned contact place holders 106 at the bottom of the source and drain regions 103. Other examples may use another contact forming process that is not necessarily self-aligned to the source and drain trenches.

In an example, the source and drain regions 103 are formed with an etch and replace process in which a trench is first etched in the locations where epitaxial source and drain regions 103 will be located, thus exposing ends of the channel regions (nanoribbons 100, in this example case). In some such cases, the trench etch process etches deeper into the underlying substrate 10, to make room for a backside contact placeholder 106. A deposition of silicon nitride, or other place holder material that can later be selectively etched out and replaced, is deposited into the trench and any excess deposition is removed, thus leaving contact placeholder 106 that is self-aligned to the source or drain trench. As such, the later formed contact 115 will also be self-aligned to the trench, as will any source or drain regions that are grown to fully occupy the trench. The dimensions of the contact placeholders 106 can vary from one example to the next, but in some example cases include a height (up and down on page), a width (left to right on page), and a length (running into and out of page) each in the range of about 15 nm to 45 nm. In some such example cases, the placeholder 106 may have a length that is greater than its width (or vice-versa). The source and drain regions 103 can then be epitaxially grown from the exposed ends of nanoribbons 100, such that each epitaxial source and drain region 103 sits on a corresponding backside contact placeholder 106. In another example, source and drain regions 103 are implantation-doped portions of the substrate 10 (or fin structure), and backside contacts 115 may be later-formed during a backside process without the benefit of contact placeholders 106.

Any number of suitable substrates can be used for substrate 10, including bulk substrates, semiconductor-on-insulator substrates (XOI, where X is a semiconductor material such as silicon, germanium, or SiGe), and multi-layered substrate structures (e.g., alternating layers of channel and sacrificial materials) suitable for forming nanoribbon channel regions. In a more general sense, any substrate suitable for forming device layer 110 can be used. In one specific embodiment, substrate 10 is a bulk silicon substrate having plurality of alternating layers of silicon and germanium formed thereon. The substrate 10 is etched into a plurality of multilayered fins, which can then be used to form the nanoribbon transistors of device layer 110. Subsequently, sacrificial layers of the multilayer fins are selectively etched away in the channel region during gate processing, thereby releasing nanoribbons 100.

Figure 5B:
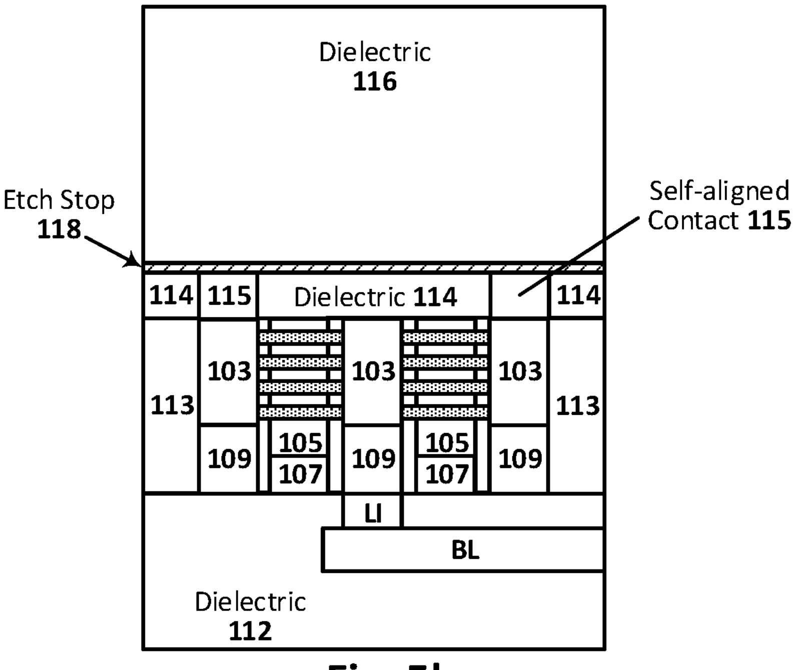

FIG. 5*b* shows an example of the resulting structure after the structure of FIG. 5*a* is inverted and substrate 10 has been removed and replaced with dielectric material 114 (e.g., silicon dioxide or other suitable dielectric), and after the backside contact placeholders 106 have been selectively etched away and replaced with backside contacts 115 (e.g., tungsten or other suitable contact material(s)), and after etch stop layer 118 and dielectric layer 116 have been provided. The previous example dimensions of contact placeholders 106 equally apply to backside contacts 115. The etch stop 118 (e.g., silicon nitride, aluminum oxide, silicon oxycarbonitride, or other suitable etch stop material) can have a thickness, for example, in the range of 2 nm to 30 nm. The thickness of dielectric layer 116 (e.g., silicon dioxide, or low-k version thereof such as carbon-doped silicon dioxide having a carbon concentration of about 10% to 12%) can also vary greatly, depending on how tall the corresponding interconnect layer will be, but in some examples is in the range of 80 nm to 1000 nm. In some examples, the height of the capacitors to be formed is about equal to the height of the first backside interconnect layer (e.g., the vertical distance between etch stop 118 and the next etch stop delineating the second interconnect layer).

Figure 5C:
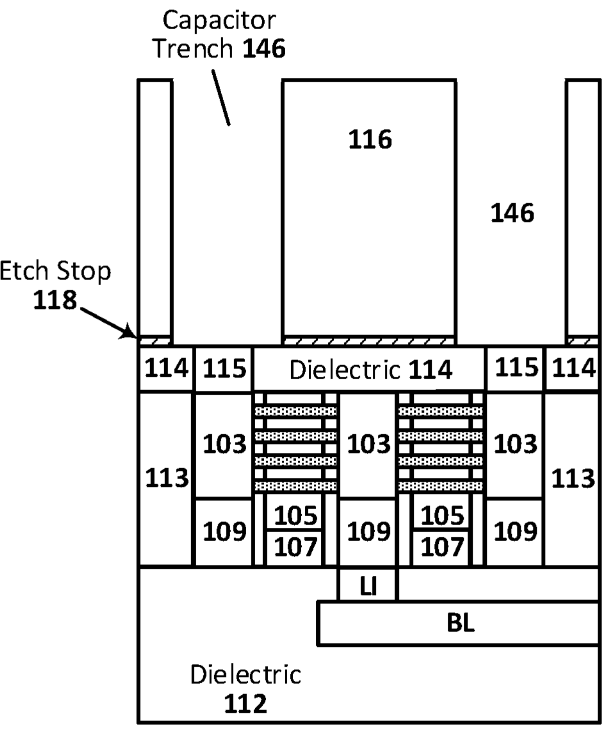

FIG. 5*c* shows an example of the resulting structure after capacitor trenches 146 have been etched into dielectric layer 116 of the structure of FIG. 5*b*. The capacitor trenches 146 can be formed using lithography, for example, by patterning a mask with openings where capacitor trenches 146 are to be formed, and then etching down into dielectric 116 to etch stop 118. A break-through etch can then be performed on etch stop 118 to expose the underlying surface of contact 115. The etch processes can be anisotropic so as to limit lateral etching. The geometry of the capacitor trenches 146 can vary from one example to the next, but in some examples the capacitor trenches 146 having a height in the range of about 125 nm to 150 nm, a width in the range of about 25 nm to 80 nm, and a length (into and out of page) in the range of about 25 nm to 80 nm. The lithography mask can then be removed, for example, via a chemical mechanical planarization (CMP) process.

Figure 5D:
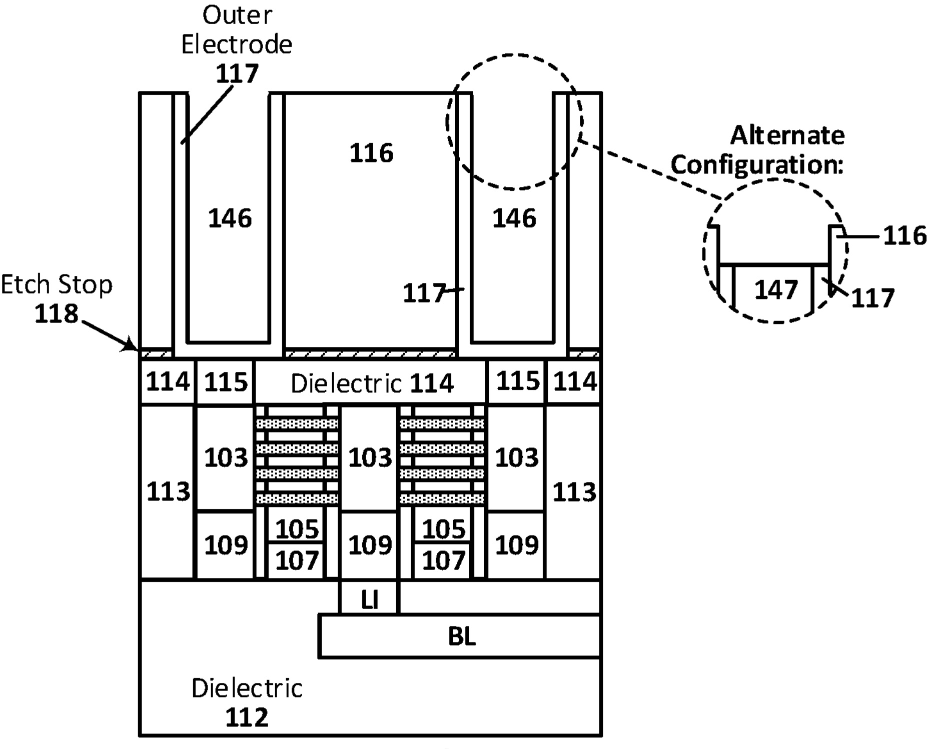

FIG. 5*d* shows an example of the structure of FIG. 5*c* after an outer electrode 117 has been deposited into each of the capacitor trenches 146. The outer electrodes 117 can be conformally deposited, for example, using atomic layer deposition (ALD) or chemical vapor deposition (CVD). The thickness of the outer electrodes 117 can vary from one example to the next, but in some example cases is in the range of 3 nm to 25 nm. Any excess deposition of electrode material on the upper surface of the structure can be removed, for example, via a CMP process. In another embodiment, the outer electrodes 117 are recessed, so as they are not on the uppermost portion near the opening of trenches 146, as shown in the dashed circle. In some such cases, the outer electrodes 117 recessed by depositing a carbon hard mask material to fill the remaining portion of trenches 146, and then recessing that carbon hard mask material to the desired height of the outer electrodes 117, thus forming recessed hard mask 147. Then the exposed portion of the outer electrodes 117 can be removed by an etch that is selective to the other exposed materials (dielectric 116 and mask 147). Once the outer electrodes 117 are recessed, the carbon mask can be removed (e.g., via an ashing process). As described above, the outer electrodes 117 can be implemented with any suitable conductive materials (e.g., copper, tungsten, molybdenum, titanium, titanium nitride, tantalum, tantalum nitride, ruthenium, or doped polysilicon).

Figures 5E, 5F:
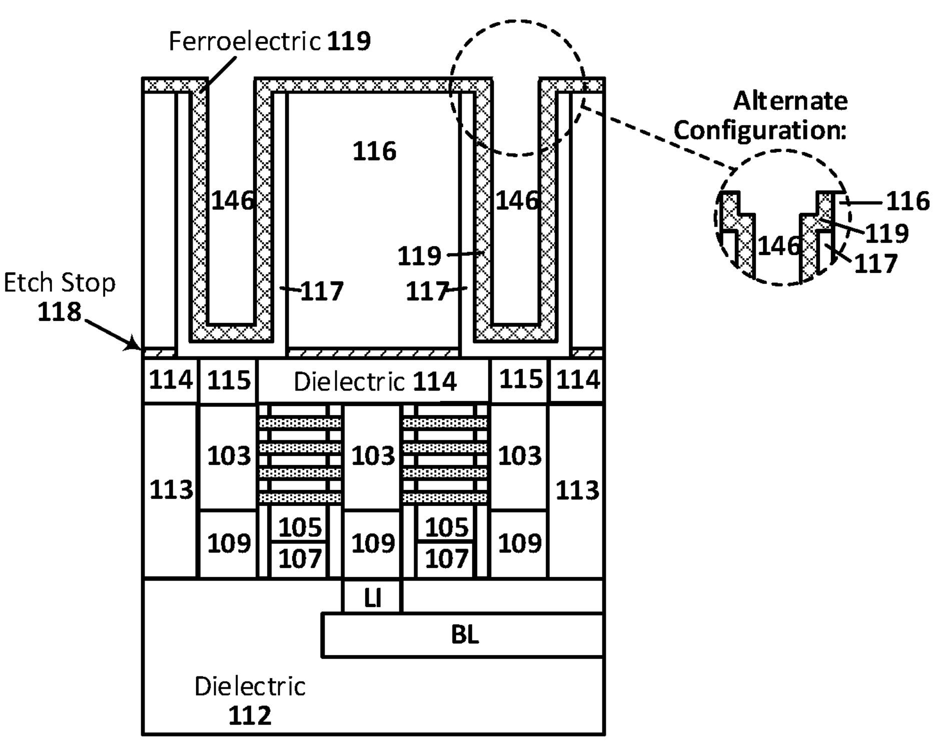

FIG. 5*e* shows an example of the structure of FIG. 5*d* after a ferroelectric layer 119 has been deposited onto the outer electrodes 117. The ferroelectric layer 119 can be conformally deposited, for example, using ALD or CVD. The thickness of the ferroelectric layer 119 can vary from one example to the next, but in some example cases is in the range of 3 nm to 25 nm. In some examples such as shown, the conformal deposition of ferroelectric material on the upper surface of the structure is left in place, which helps in preventing a short between the inner and outer electrodes and improves process margin with respect to the interconnect feature that will contact a later-formed inner electrode 121. In another embodiment in which the outer electrodes 117 are recessed, the deposition of ferroelectric material on the upper surface of the structure can be removed (e.g., via CMP), as shown in the dashed circle. In such an example, the improved process margin is achieved by way of the recessed outer electrode 117. As described above, the ferroelectric layer 119 can be implemented with any suitable ferroelectric materials (e.g., PTO, PZT, PLZT, BTO, HZO, or AlScN, to name a few examples).

FIG. 5*f* shows an example of the structure of FIG. 5*e* after an inner electrode 121 has been deposited onto the ferroelectric layer 119. The inner electrode 121 can be deposited, for example, using ALD or CVD, so as to fill the remaining portion of trenches 146. Any excess deposition of electrode material on the upper surface of the structure can be removed, for example, via a CMP process. As described above, the configuration shown within the dashed circle helps in preventing a short between the inner electrode 121 and outer electrode 117 so as to improve process margin during a subsequent interconnect process to contact the inner electrode 121. As described above, the inner electrode 121 can be implemented with any suitable electrode materials, including those described above. The inner electrodes 121 may be compositionally the same as the outer electrodes 117, but they need not be. In some such cases, for instance, the outer electrodes 117 comprise titanium, titanium nitride, tantalum, tantalum nitride, tungsten, and the inner electrodes comprise copper fill.

According to some embodiments, once the capacitor structures are formed, the next interconnect layer can be formed, such as discussed with respect to FIGS. 2*a-b*. In one example case, the a dual damascene process is used to connect to the inner electrode 121 to a conductive line (e.g., line 123) by way of a via (e.g., via 122). Further recall that different sections of the interconnect structure can be processed at different times. For instance, the memory section can be processed while the logic section is masked off, and vice-versa.

FIGS. 6*a*-*g* are each a cross-sectional view that illustrates a stage in an example process for forming semiconductor devices that have a backside memory structure implemented with ferroelectric capacitors, in accordance with another embodiment of the present disclosure. The resulting structure may be at least in part similar to one of the structures described with reference to FIGS. 3*a*-*b*. The process may begin with a structure as shown in FIG. 5*a*. The above relevant discussion with respect to similar features is equally applicable here, including example materials and dimensions and forming techniques.

Figure 6A:
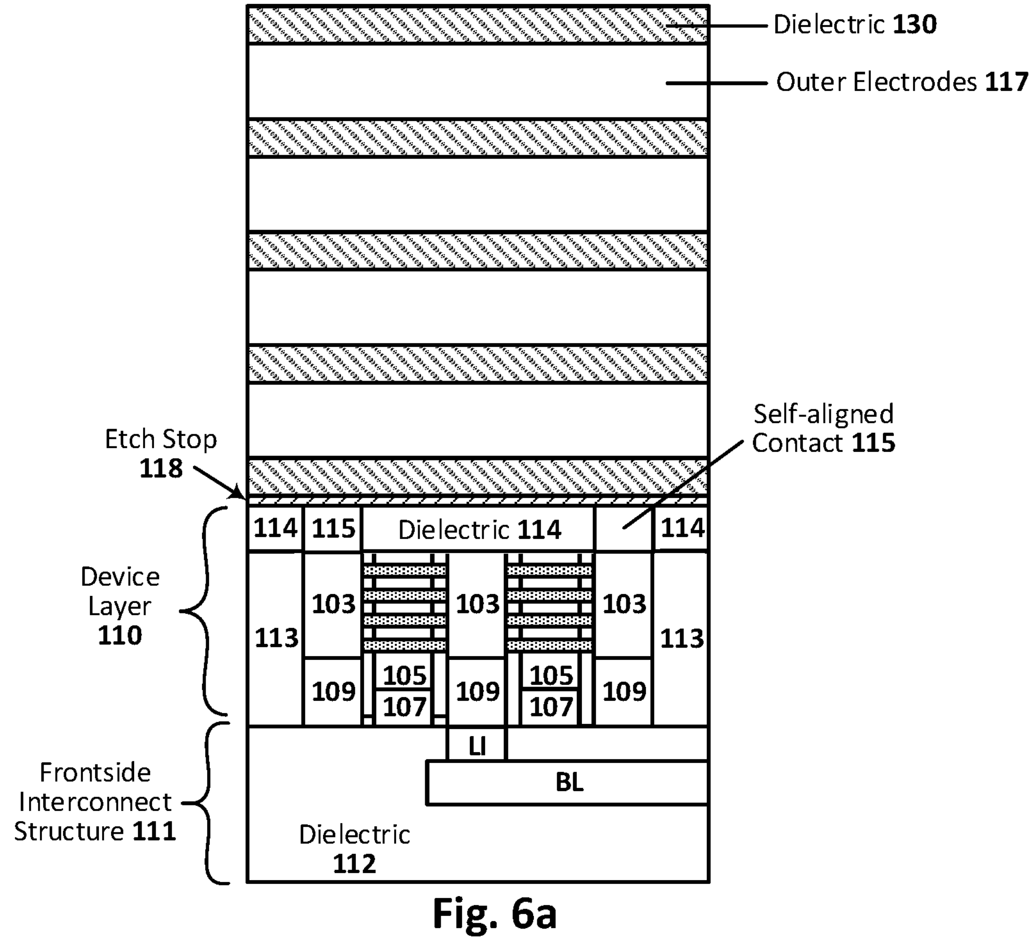
FIGS. 6*a-g* are each a cross-sectional view that illustrates a stage in an example process for forming semiconductor devices that have a backside memory structure implemented with ferroelectric capacitors, in accordance with another embodiment of the present disclosure.

FIG. 6*a* shows an example of the resulting structure after the structure of FIG. 5*a* is inverted and substrate 10 has been removed and replaced with dielectric material 114 (e.g., silicon dioxide or other suitable dielectric), and after the backside contact placeholders 106 have been selectively etched away and replaced with backside contacts 115 (e.g., tungsten or other suitable contact material(s)), and after etch stop layer 118 and the stack of alternating dielectric layers 130 and conductive layers 117 (which become outer electrodes 117) have been provided. The dielectric layers 130 and conductive layers 117 can be deposited using any suitable deposition process, including ALD, CVD, or physical vapor deposition (PVD). The thickness of each layer can vary from one example to the next, but in some examples the dielectric layers 130 have a thickness in the range of 5 nm to 50 nm, and the conductive layers 117 have a thickness in the range of 30 nm to 500 nm (e.g., 80 nm to 150 nm). Dielectric layers 130 can be, for example, low-k silicon dioxide doped with carbon, or silicon nitride, and conductive layers 117 may comprise any suitable electrode materials such as those described above (e.g., doped polysilicon, titanium nitride, tantalum nitride, or molybdenum).

At this point, the staircase structure (not shown in profile of FIG. 6*a*, but shown in FIG. 3*b*) can be formed with standard staircase etch processing such as used in forming 3D NAND memory, or any other suitable etch process. For example, in one embodiment, a hardmask is provisioned over the stack of alternating layers 130 and 117. The hardmask is then photographically patterned and etched to the depth of a single step, and the riser including topmost layers 130 and 117 is exposed. The hardmask is then etched sideways (sometimes called a pull-back etch) to the tread width of the next step, and the next pair of layers 130 and 117 are etched to the depth of a single step, and the riser of that next step is formed. This process is repeated for each step of the staircase, until the staircase is formed. Although the example staircase structure of FIG. 3*b* shows four full steps, any number of steps can be provisioned. The staircase is then planarized with dielectric fill material 116, and recesses to the plate line 117 of each step are then patterned, etched and filled with conductive material, to provide plate line vias (e.g., 135, 137) each landing on the plate line 117 of a corresponding step. The height-to-width aspect ratio of the resulting plate line vias can vary from one example to the next, but in some cases the height-to-width aspect ratio of the tallest plate line via (e.g., 135) can be very high, such as 5:1, 8:1, 10:1, or higher (where a given plate line via has a maximum width of about 25 nm and a height of about 100 nm, or a maximum width of about 50 nm and a height of about 500 nm. More generally, the staircase structure and plate line vias can be formed using any suitable technology. With the stair case structure now formed, the ferroelectric capacitors can be formed.

Figure 6B:
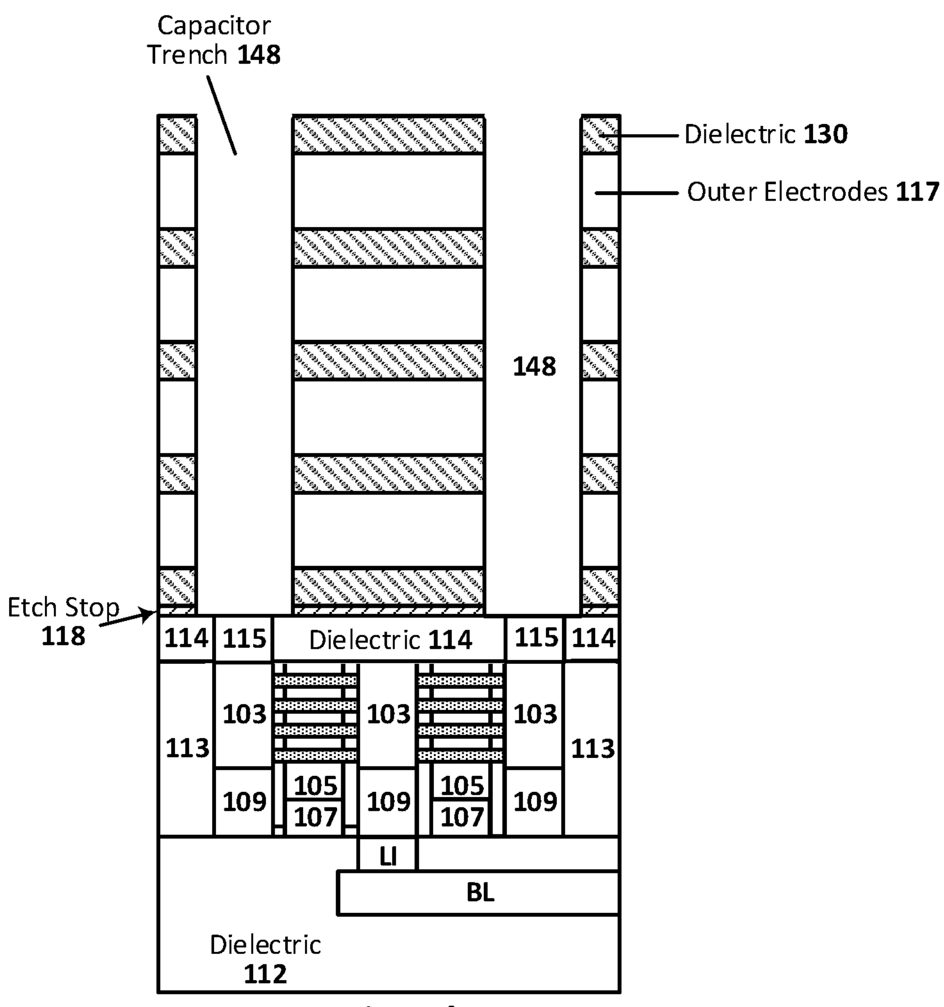

FIG. 6*b* shows an example of the structure of FIG. 6*a* after capacitor trenches 148 have been etched into the stack of alternating layers. The capacitor trenches 148 can be formed using lithography, for example, by patterning a mask with openings where capacitor trenches 148 are to be formed, and then etching down through the stack to etch stop 118. A break-through etch can then be performed on etch stop 118 to expose the underlying surface of contact 115. The etch processes can be anisotropic so as to limit lateral etching. The geometry of the capacitor trenches 148 can vary from one example to the next, but in some examples the capacitor trenches 148 having a height in the range of about 125 nm to 500 nm (e.g., height of the first and second backside interconnect layers), a width in the range of about 25 nm to 80 nm, and a length (into and out of page) in the range of about 25 nm to 80 nm. Note the second backside interconnect layer may be taller (or shorter) than the first backside interconnect layer. The lithography mask can then be removed, for example, via a CMP process.

Figure 6C:
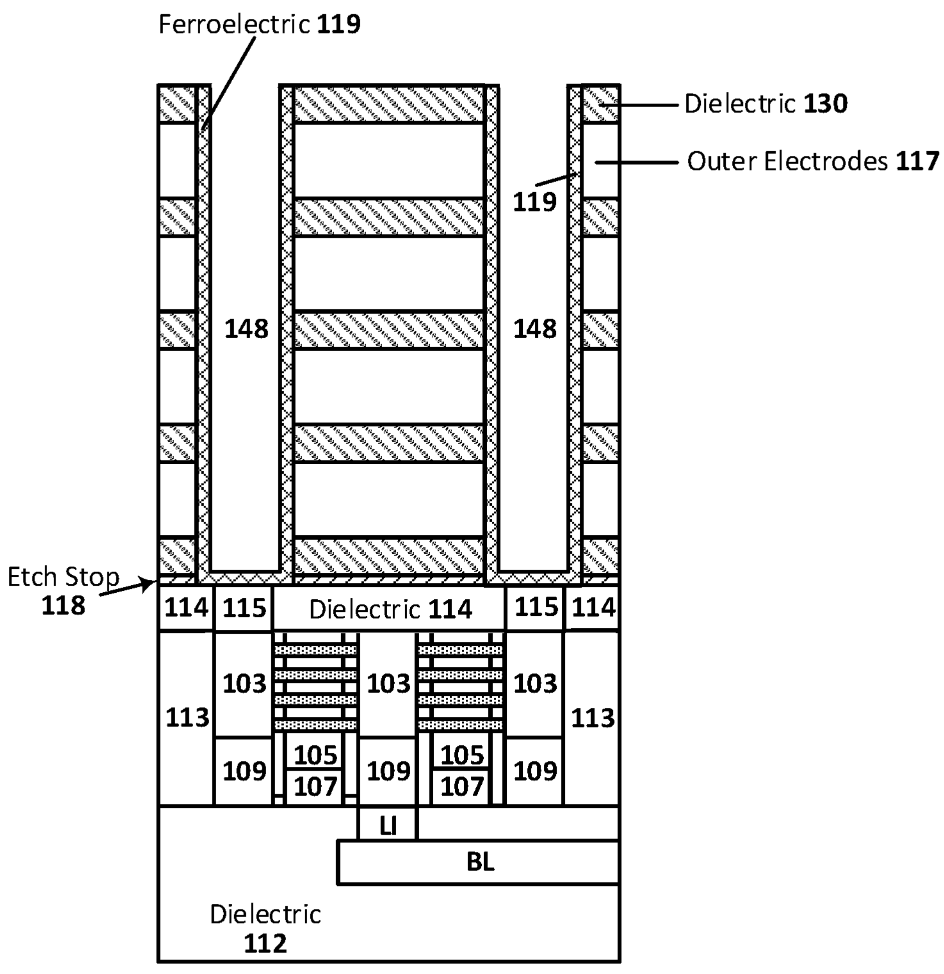
Figure 6D:
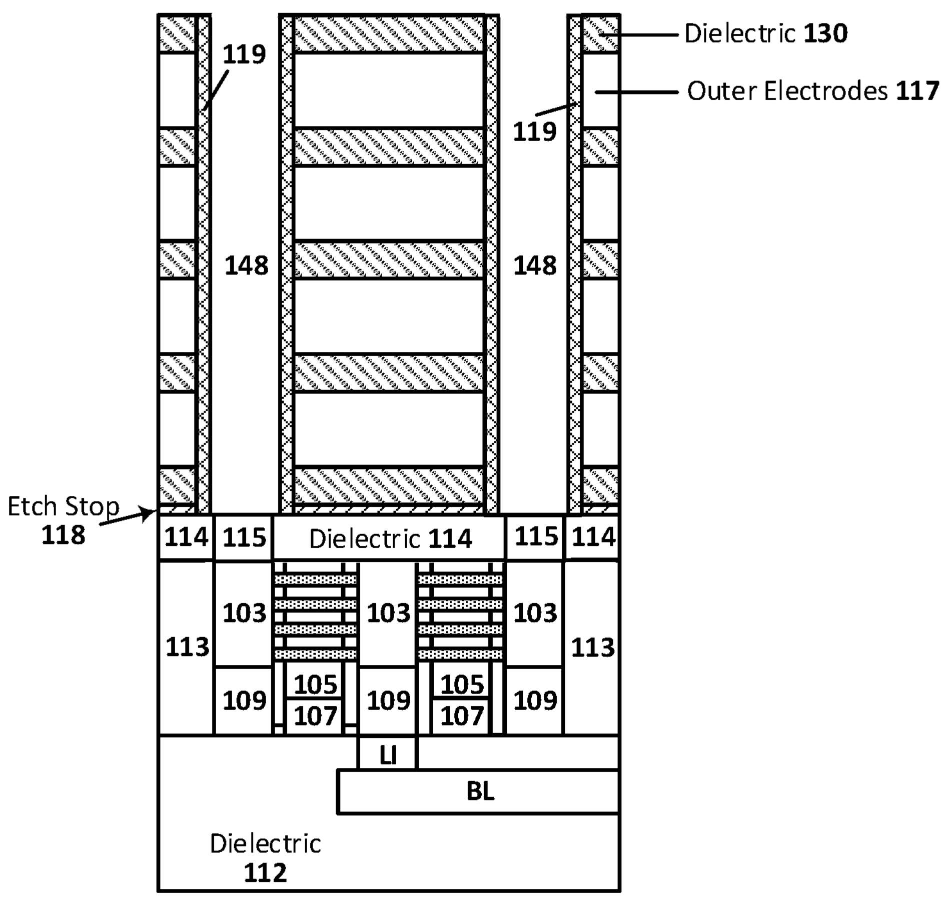

FIG. 6*c* shows an example of the structure of FIG. 6*b* after ferroelectric layer 119 has been deposited into each of the capacitor trenches 148. The ferroelectric layer 119 can be conformally deposited, for example, using ALD or CVD. The thickness of the ferroelectric layer 119 can vary from one example to the next, but in some example cases is in the range of 3 nm to 25 nm. As shown, the ferroelectric layer 119 conformally deposits along sidewalls of the dielectric layer 130 and the outer electrodes 117, as well as the underlying surface of the backside contact 115. FIG. 6*d* shows an example of the structure of FIG. 6*c* after the ferroelectric layer 119 has directionally etched to remove horizontal portion along the underlying surface of the backside contact 115. Any remaining excess deposition of ferroelectric material 119 on the upper surface of the structure can be removed, for example, via a CMP process.

Figure 6E:
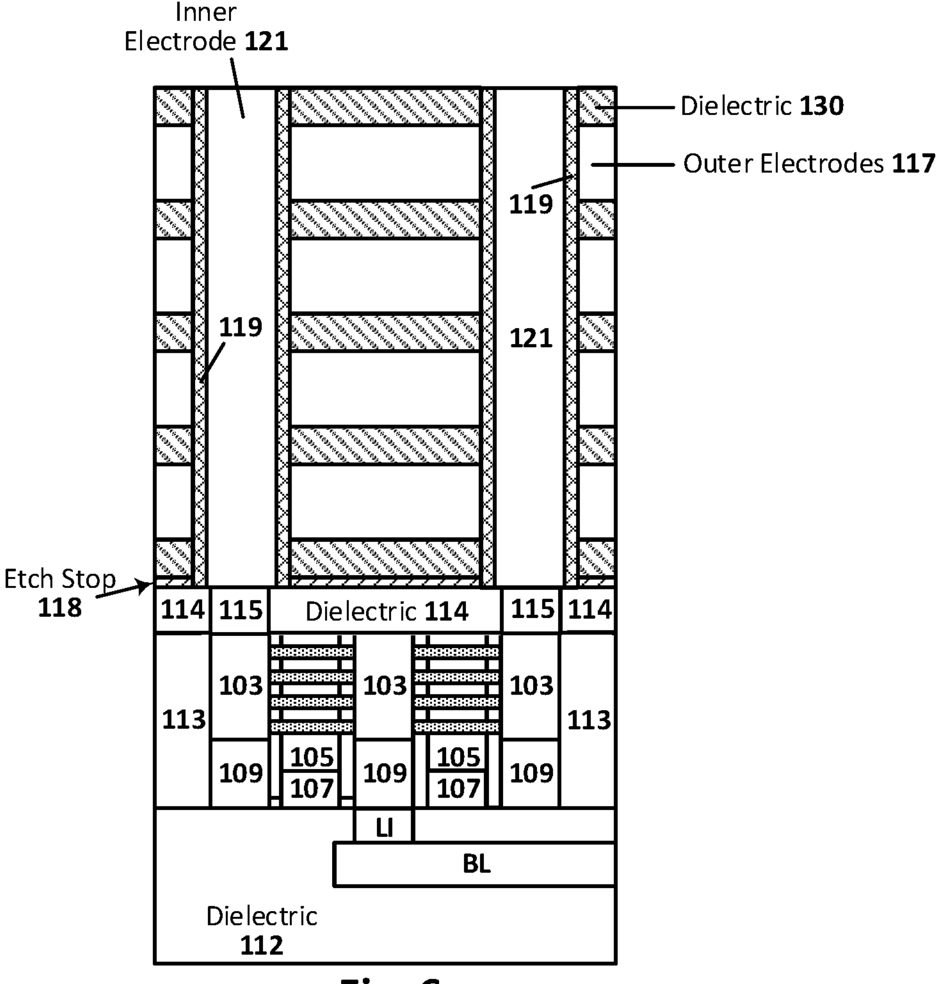

FIG. 6*e* shows an example of the structure of FIG. 6*d* after an inner electrode 121 has been deposited onto the ferroelectric layer 119 and underlying backside contact 115. The inner electrode 121 can be deposited, for example, using ALD or CVD, so as to fill the remaining portion of trenches 148. Any excess deposition of electrode material on the upper surface of the structure can be removed, for example, via a CMP process.

Figure 6F:
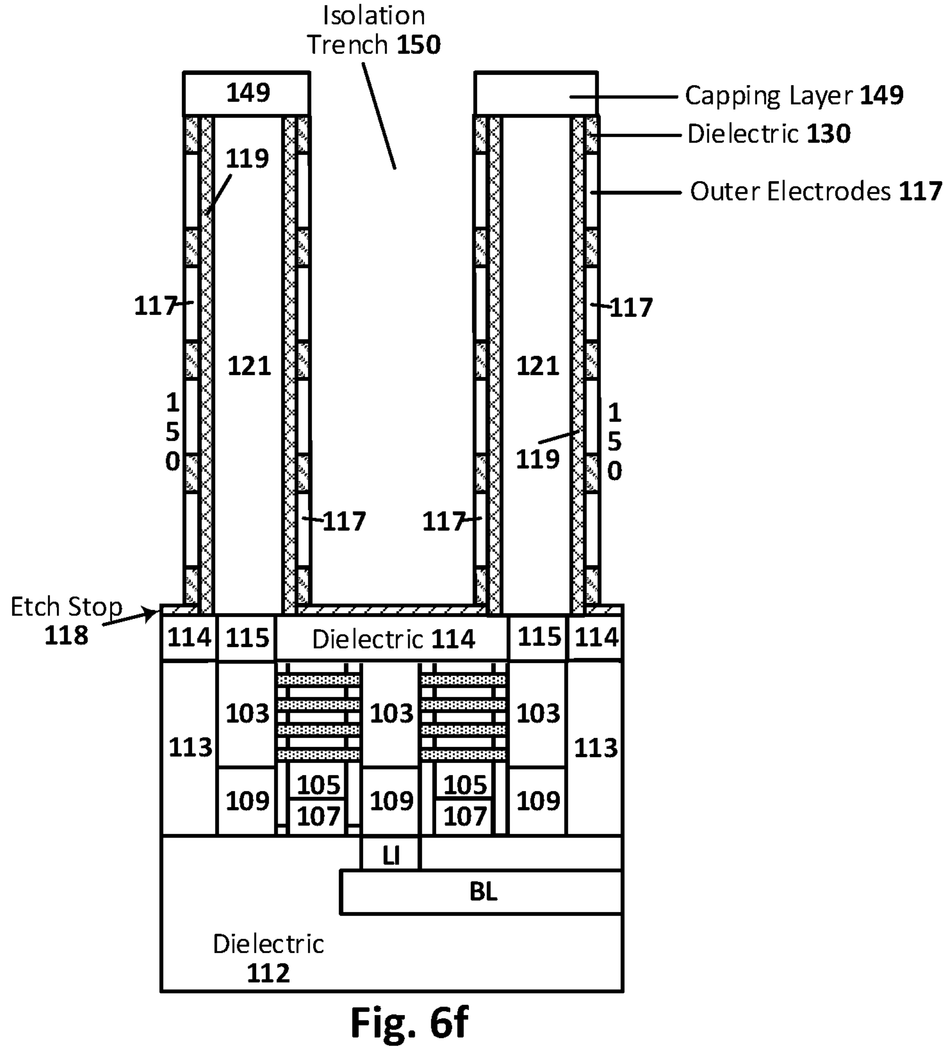
Figure 6G:
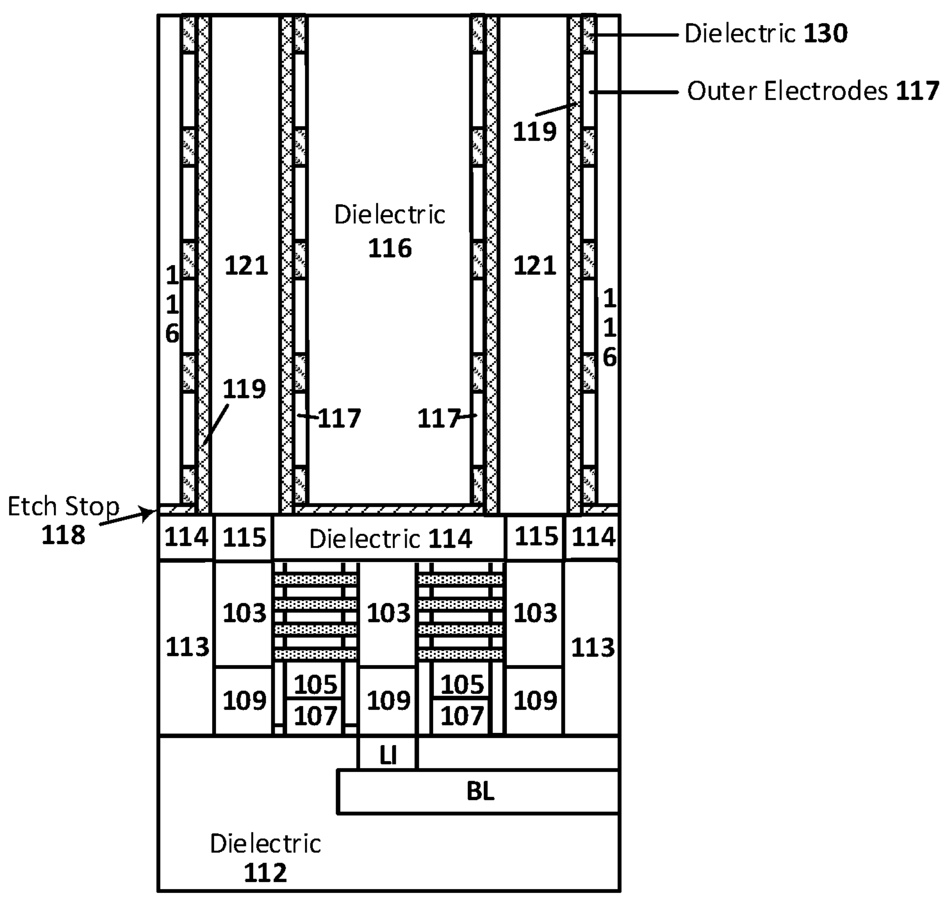

FIG. 6*f* shows an example of the structure of FIG. 6*e* after capping layer 149 has been patterned and isolation trenches 150 have been etched. As described above, capping layer 149 acts as a hard mask while etching down through the stack of alternating layers to form isolation trenches 150. In this example, the isolation trenches 150 land on etch stop 118. The dimensions of a given isolation trench 150 can vary from one example to the next, but in some examples the isolation trench 150 has a width (left to right on the page) of about 10 nm to 100 nm) and a length that (into and out of page) extends the entire length of the memory array. FIG. 6*g* shows an example of the structure of FIG. 6*f* after dielectric 116 has been deposited and planarized. In this example, capping layer 149 has been removed during the planarization process. In other examples capping layer 149 may be left intact in the final structure, such that dielectric 116 is planarized to the top of capping layer 149.

Once the 1T-4F capacitor structures are formed, the next interconnect layer can be formed, such as discussed with respect to FIGS. 2*a*-*b*. In one example case, the a dual damascene process is used to connect to the inner electrode 121 to a conductive line (e.g., line 123) by way of a via (e.g., via 122). Further recall that different sections of the interconnect structure can be processed at different times. For instance, the memory section can be processed while the logic section is masked off, and vice-versa.

FIGS. 7*a-i* are each a cross-sectional view that illustrates a stage in an example process for forming semiconductor devices that have a backside memory structure implemented with ferroelectric capacitors, in accordance with another embodiment of the present disclosure. The resulting structure may be at least in part similar to one of the structures described with reference to FIGS. 4*a-b*. The process may begin with a structure as shown in FIG. 5*a*. The above relevant discussion with respect to similar features is equally applicable here, including example materials and dimensions and forming techniques.

Figure 7A:
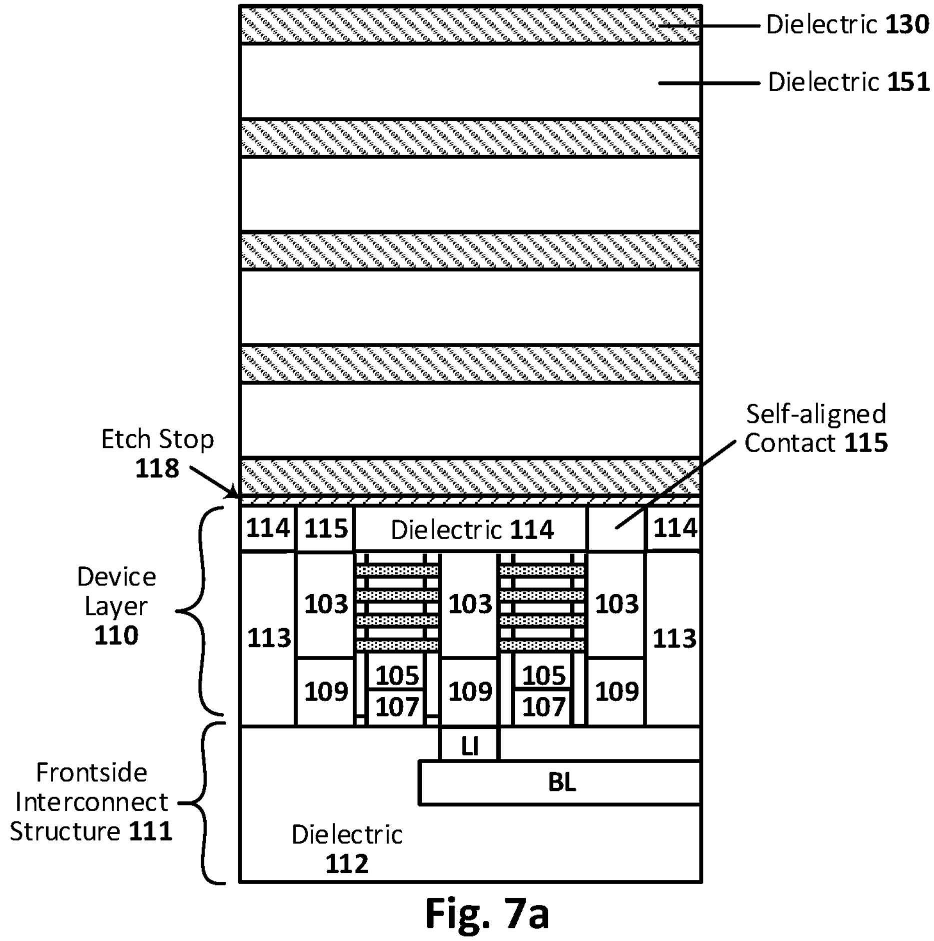
FIGS. 7*a-i* are each a cross-sectional view that illustrates a stage in an example process for forming semiconductor devices that have a backside memory structure implemented with ferroelectric capacitors, in accordance with another embodiment of the present disclosure.

FIG. 7*a* shows an example of the resulting structure after the structure of FIG. 5*a* is inverted and substrate 10 has been removed and replaced with dielectric material 114 (e.g., silicon dioxide or other suitable dielectric), and after the backside contact placeholders 106 have been selectively etched away and replaced with backside contacts 115 (e.g., tungsten or other suitable contact material(s)), and after etch stop layer 118 and the stack of alternating dielectric layers 130 and 151 have been provided. The dielectric layers 130 and 151 can be deposited using any suitable deposition process, including ALD, CVD, or PVD. The thickness of each layer can vary from one example to the next, but in some examples the dielectric layers 130 have a thickness in the range of 5 nm to 50 nm, and the dielectric layers 151 have a thickness in the range of 30 nm to 500 nm (e.g., 80 nm to 150 nm). In an example, dielectric layers 130 and 151 are etch selective with respect to each other. In one such example, dielectric layers 130 can be, for example, low-k silicon dioxide doped with carbon, and dielectric layers 151 can be silicon nitride.

At this point, the staircase structure (not shown in profile of FIG. 7*a*, but shown in FIG. 4*b*) can be formed with standard staircase etch processing such as used in forming 3D NAND memory, or any other suitable etch process, as described above, and that description is equally applicable here. With the stair case structure now formed, the ferroelectric capacitors can be formed.

Figure 7B:
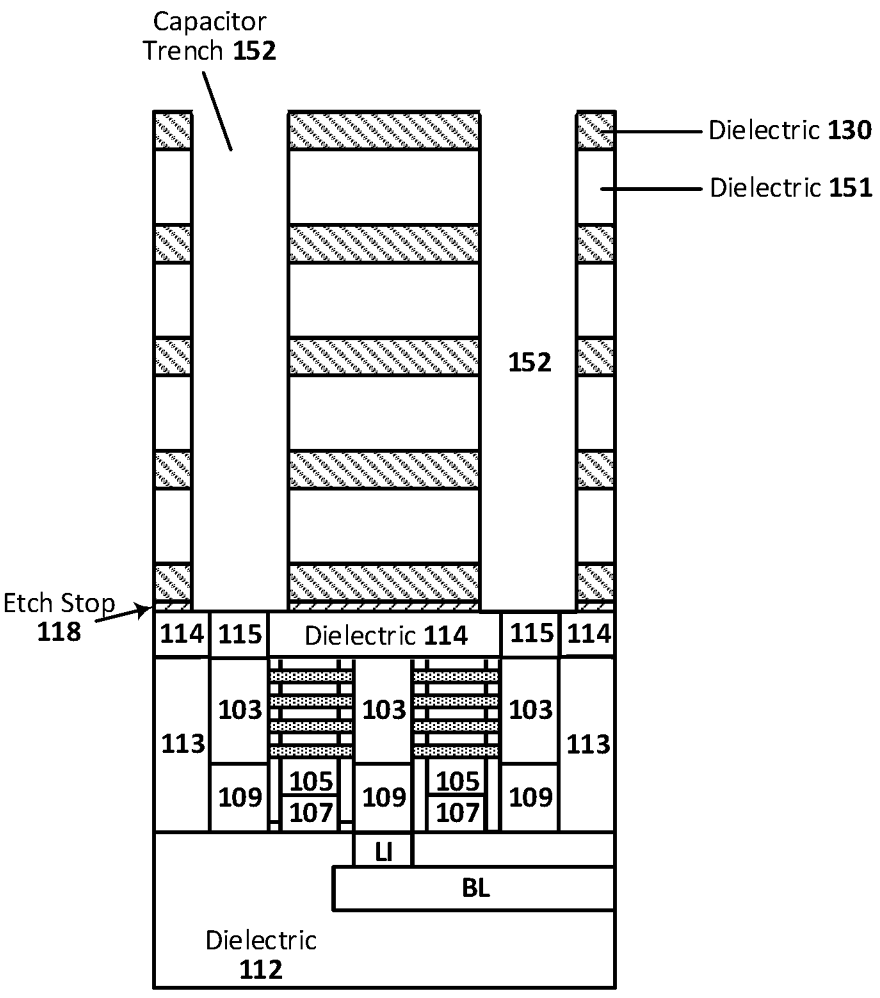

FIG. 7*b* shows an example of the structure of FIG. 7*a* after capacitor trenches 152 have been etched into the stack of alternating layers. The capacitor trenches 152 can be formed using lithography, for example, by patterning a mask with openings where capacitor trenches 152 are to be formed, and then etching down through the stack to etch stop 118. A break-through etch can then be performed on etch stop 118 to expose the underlying surface of contact 115. The etch processes can be anisotropic so as to limit lateral etching. The geometry of the capacitor trenches 152 can vary from one example to the next, but in some examples the capacitor trenches 152 having a height in the range of about 125 nm to 500 nm (e.g., height of the first and second backside interconnect layers), a width in the range of about 25 nm to 80 nm, and a length (into and out of page) in the range of about 25 nm to 80 nm. Note the second backside interconnect layer may be taller (or shorter) than the first backside interconnect layer. The lithography mask can then be removed, for example, via a CMP process.

Figure 7C:
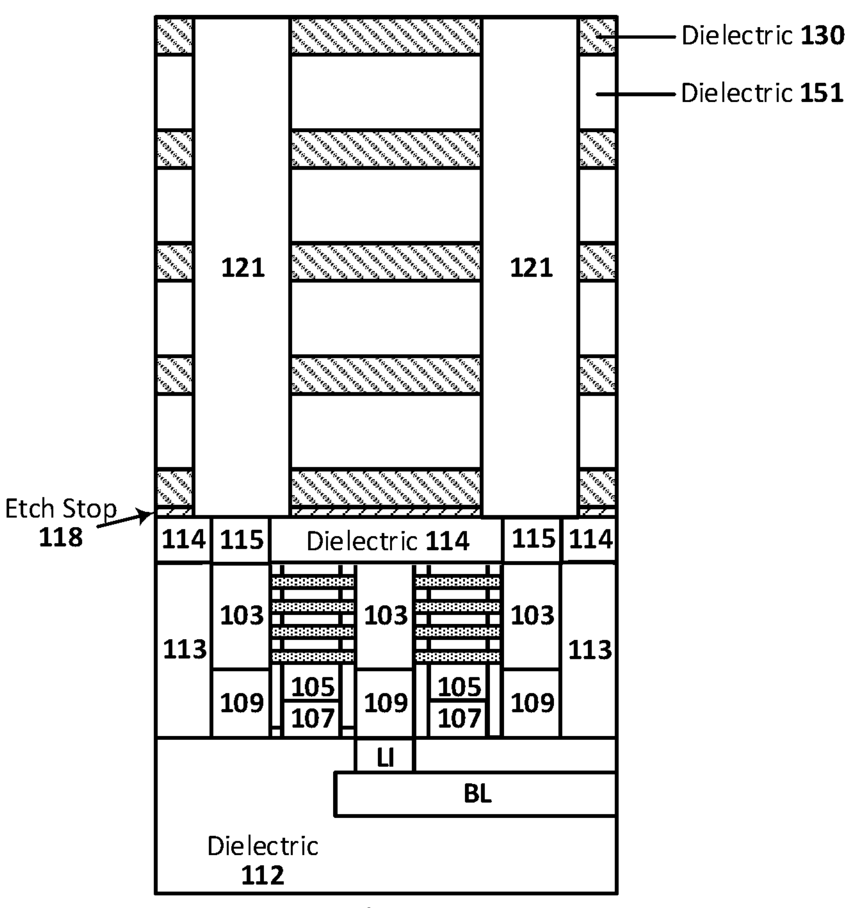
Figure 7D:
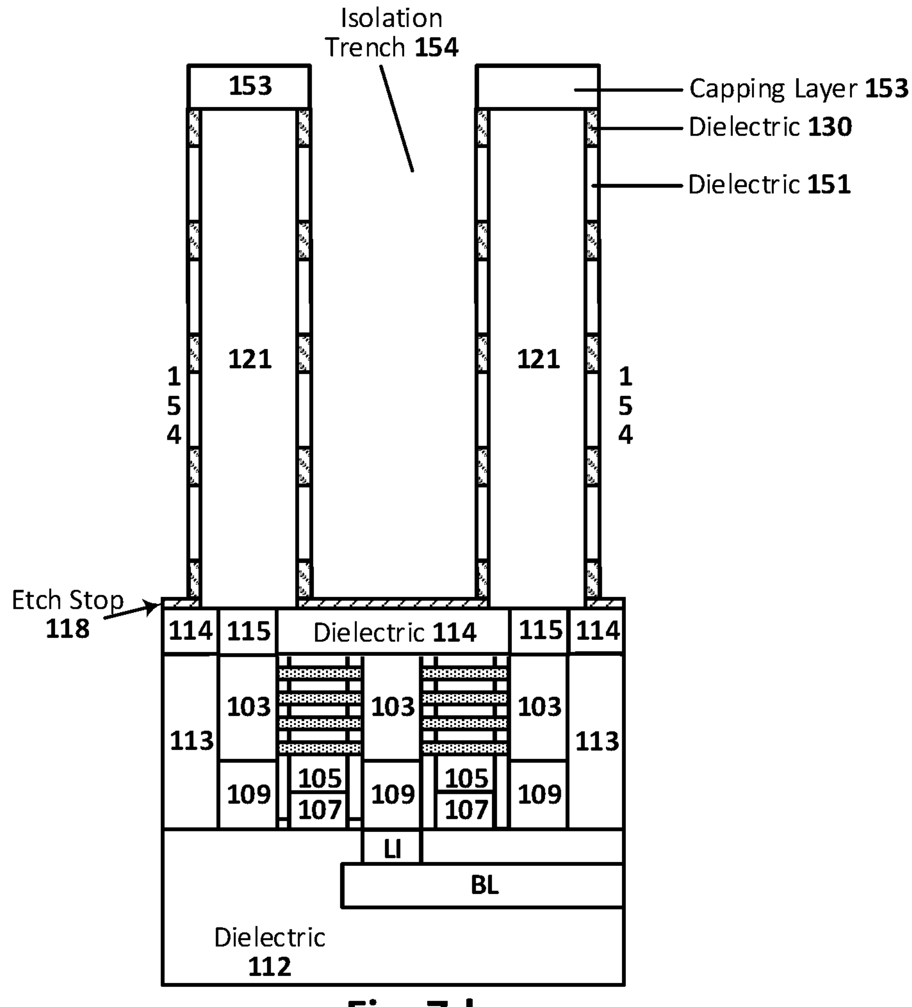

FIG. 7*c* shows an example of the structure of FIG. 7*b* after an inner electrode 121 has been deposited into capacitor trenches 152 and on underlying backside contact 115. The inner electrode 121 can be deposited, for example, using ALD or CVD, so as to fill trenches 152. Any excess deposition of electrode material on the upper surface of the structure can be removed, for example, via a CMP process. FIG. 7*d* shows an example of the structure of FIG. 7*c* after capping layer 153 has been patterned and isolation trenches 154 have been etched. The above relevant discussion with respect to capping layer 149 and the isolation trenches 150 is equally applicable here.

Figure 7E:
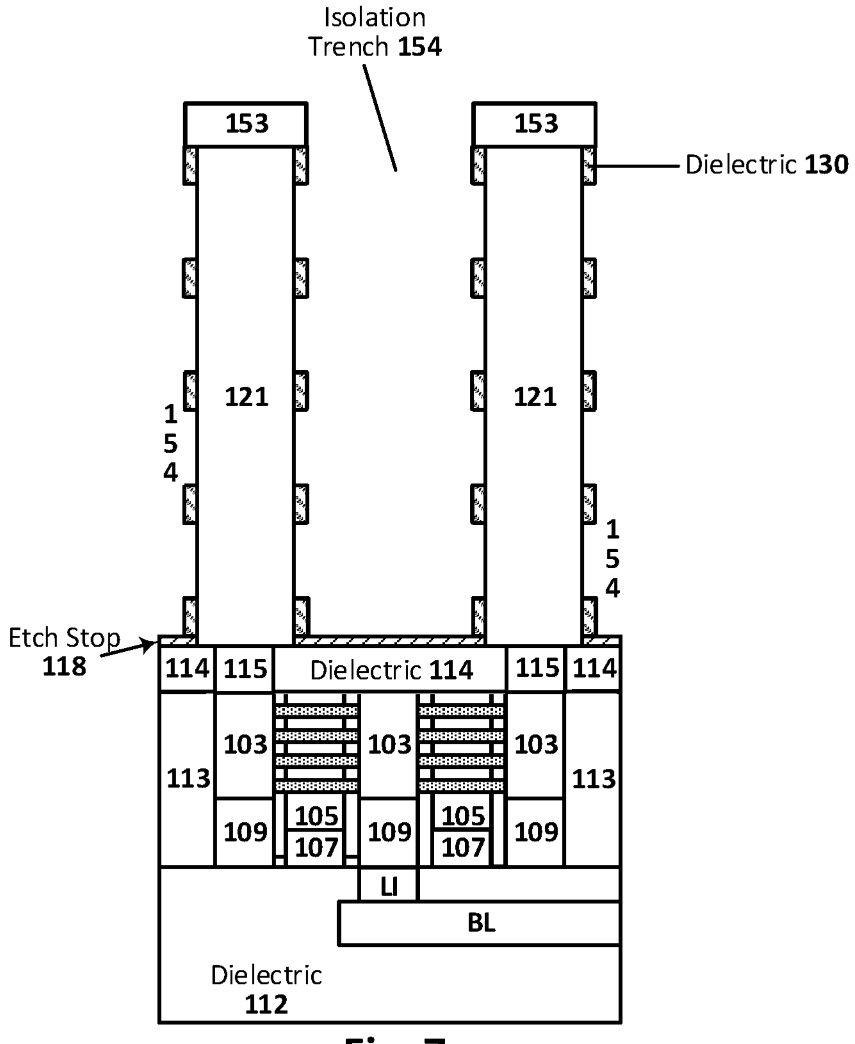
Figure 7F:
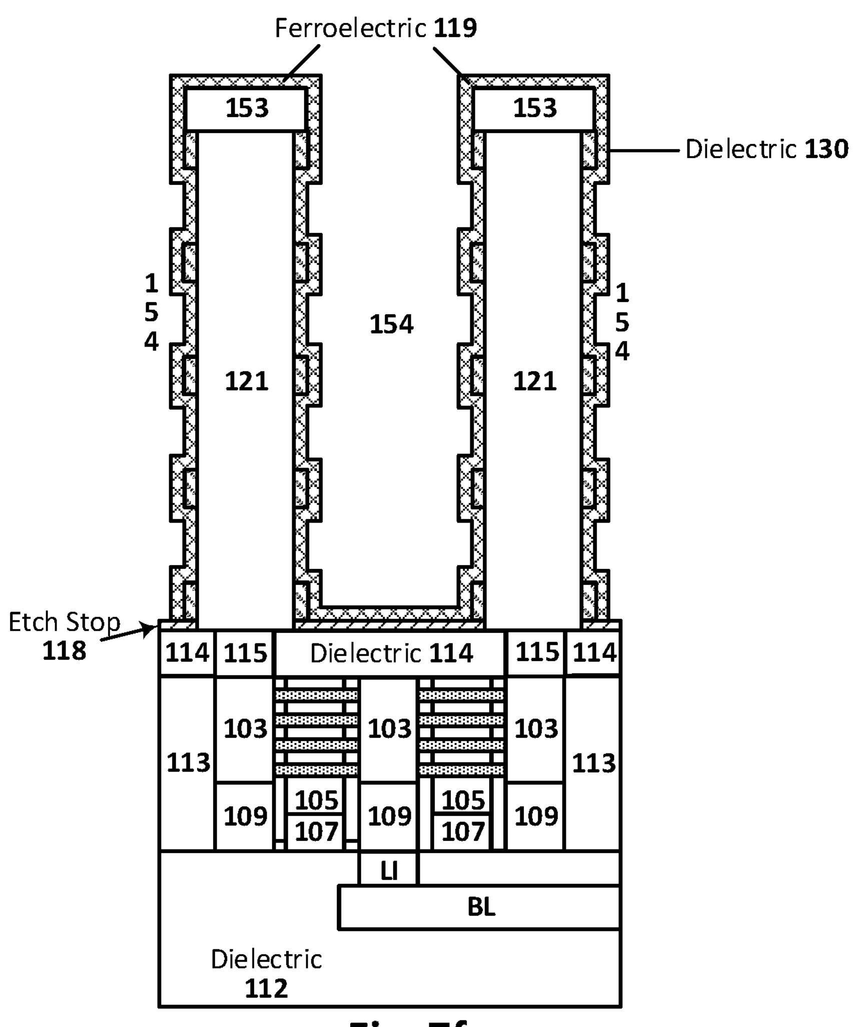

FIG. 7*e* shows an example of the structure of FIG. 7*d* after dielectric layers 151 have been removed by way of an isotropic etch that is selective to dielectric layers 130, and other exposed materials such as capping layer 153, inner electrode 121, and etch stop 118. FIG. 7*f* shows an example of the structure of FIG. 7*e* after ferroelectric layer 119 has been conformally deposited over the structure. As shown, the ferroelectric layer 119 deposits on exposed surfaces of each of the capping layer 153, dielectric layers 130, inner electrodes 121, and etch stop 118.

Figure 7G:
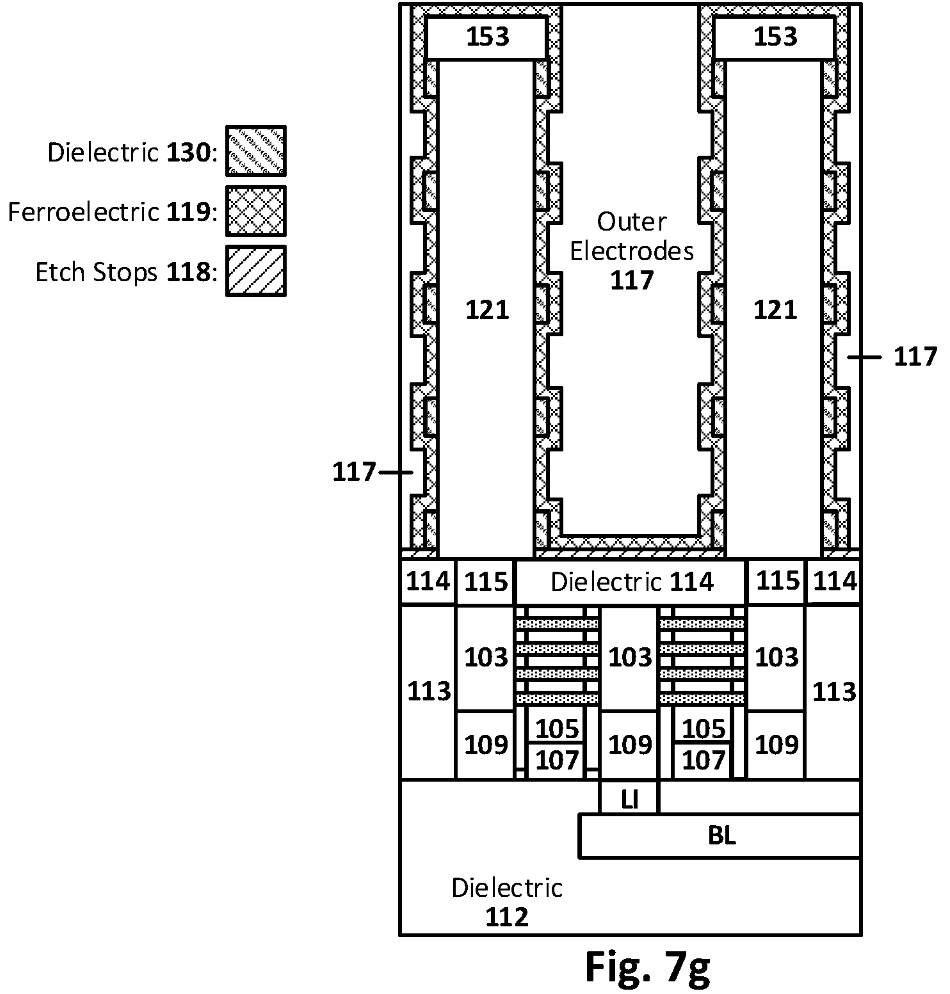

FIG. 7*g* shows an example of the structure of FIG. 7*f* after an outer electrode 117 has been deposited onto the ferroelectric layer 119, to fill the remaining structure. Any excess deposition of electrode material on the upper surface of the structure can be removed, for example, via a CMP process. In this example, planarization stops on the ferroelectric layer 119.

Figure 7H:
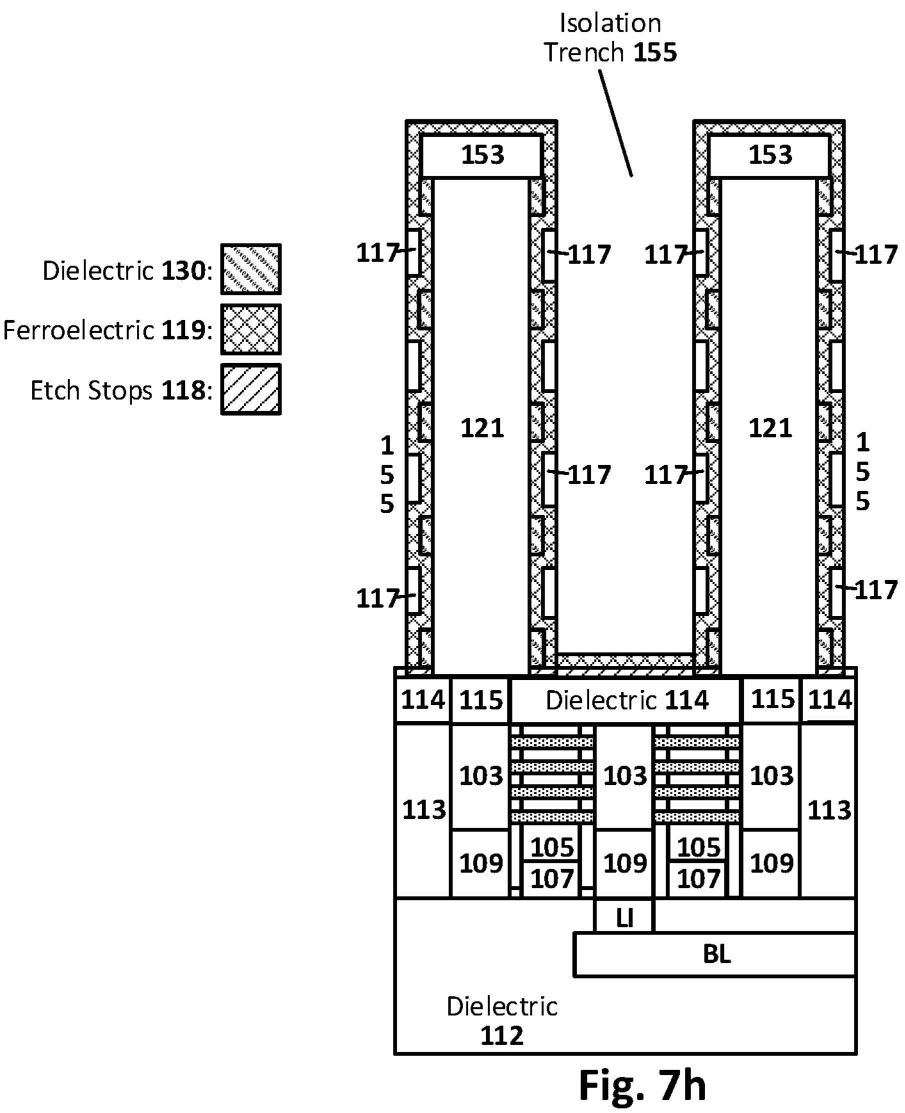
Figure 7I:
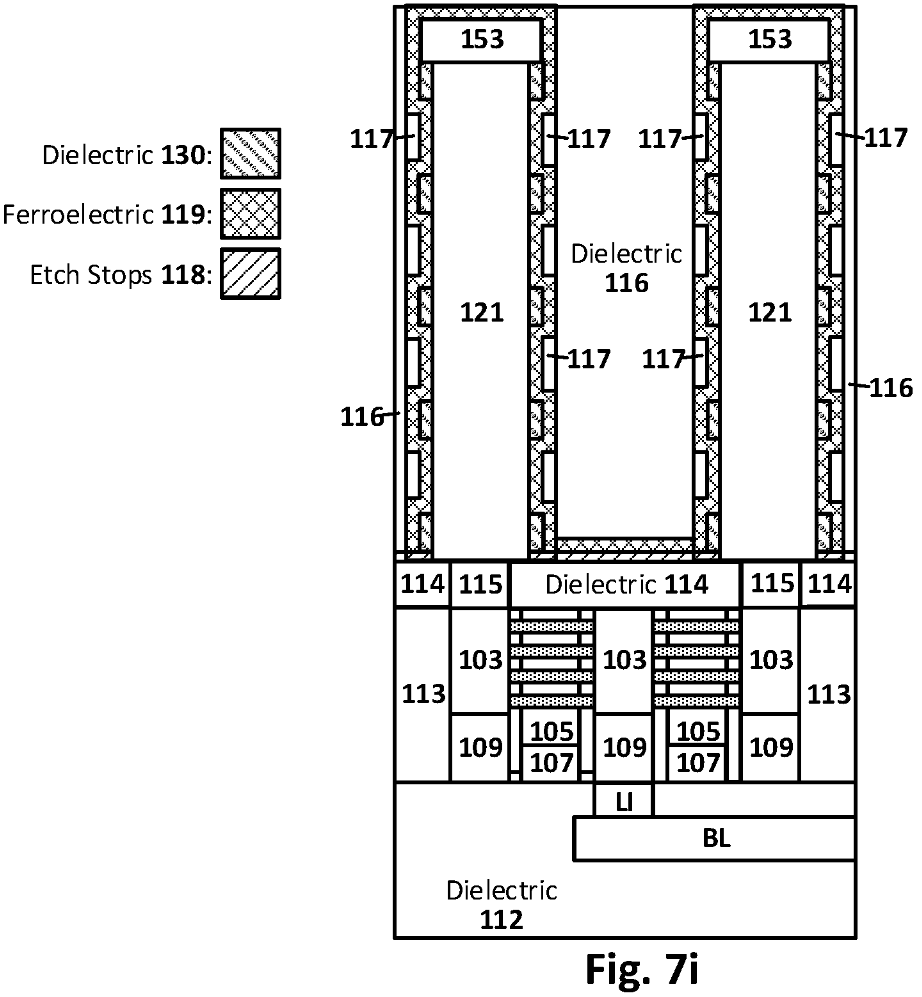

FIG. 7*h* shows an example of the structure of FIG. 7*g* after isolation trenches 155 have been etched. In this example, the isolation trenches 155 land on the ferroelectric layer 119. The above relevant discussion with respect to capping layer 149 and the isolation trenches 150 is equally applicable here. FIG. 7*i* shows an example of the structure of FIG. 7*h* after dielectric 116 has been deposited and planarized.

Once the 1T-4F capacitor structures are formed, the next interconnect layer can be formed, such as discussed with respect to FIGS. 2*a-b*. In one example case, the a dual damascene process is used to connect to the inner electrode 121 to a conductive line (e.g., line 123) by way of a via (e.g., via 122). In this example, the processing for the next interconnect layer may include a CMP process to planarize the structure down to the bottom of the inner electrodes 121, so as to remove capping layer 153. Further recall that different sections of the interconnect structure can be processed at different times. For instance, the memory section can be processed while the logic section is masked off, and vice-versa.

FIGS. 8*a-j* are each a cross-sectional view that illustrates a stage in an example process for forming semiconductor devices that have a backside memory structure implemented with ferroelectric capacitors, in accordance with another embodiment of the present disclosure. The resulting structure may be at least in part similar to one of the structures described with reference to FIGS. 3*a-b*. The process may begin with a structure as shown in FIG. 5*a*. The above relevant discussion with respect to similar features is equally applicable here, including example materials and dimensions and forming techniques.

Figure 8A:
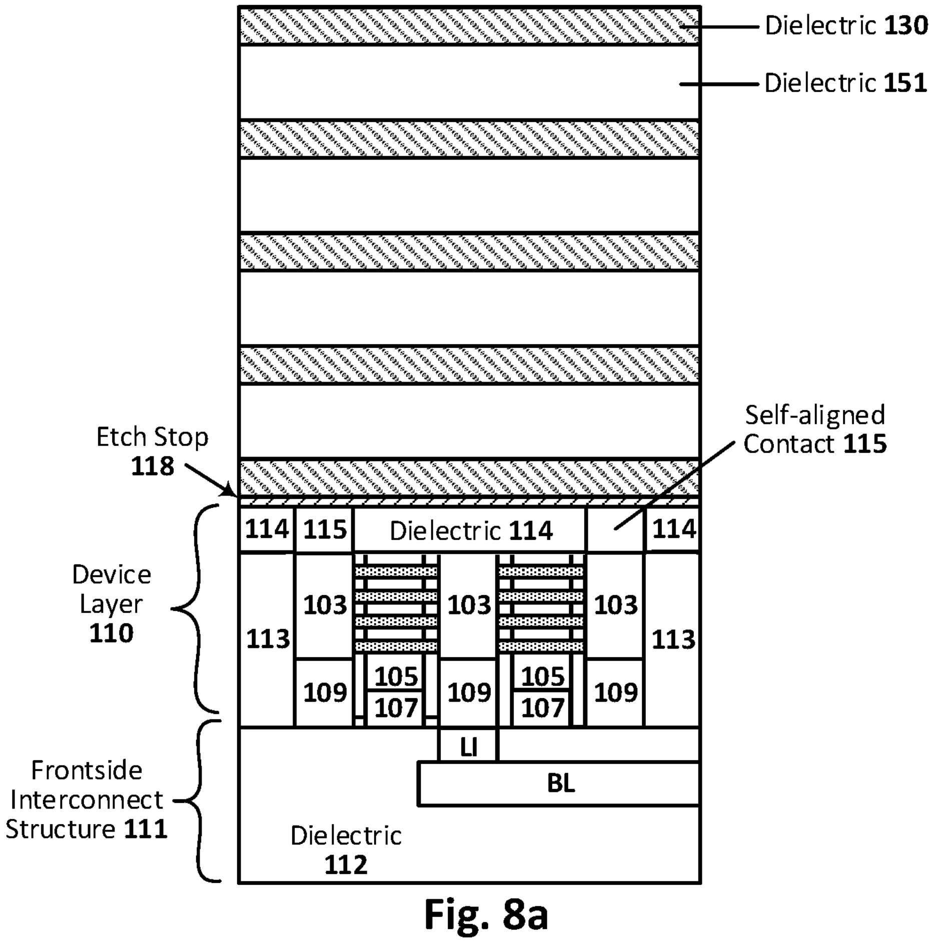
FIGS. 8*a-j* are each a cross-sectional view that illustrates a stage in an example process for forming semiconductor devices that have a backside memory structure implemented with ferroelectric capacitors, in accordance with another embodiment of the present disclosure.

FIG. 8*a* shows an example of the resulting structure after the structure of FIG. 5*a* is inverted and substrate 10 has been removed and replaced with dielectric material 114 (e.g., silicon dioxide or other suitable dielectric), and after the backside contact placeholders 106 have been selectively etched away and replaced with backside contacts 115 (e.g., tungsten or other suitable contact material(s)), and after etch stop layer 118 and the stack of alternating dielectric layers 130 and 151 have been provided. The stack of alternating layers 130 and 151 can be implemented in a similar fashion as described with reference to FIG. 7*a*, and that relevant description is equally applicable here. At this point, the staircase structure (not shown in profile of FIG. 8*a*, but shown in FIG. 3*b*) can be formed with standard staircase etch processing such as used in forming 3D NAND memory, or any other suitable etch process, as described above, and that description is equally applicable here. With the stair case structure now formed, the ferroelectric capacitors can be formed.

Figure 8B:
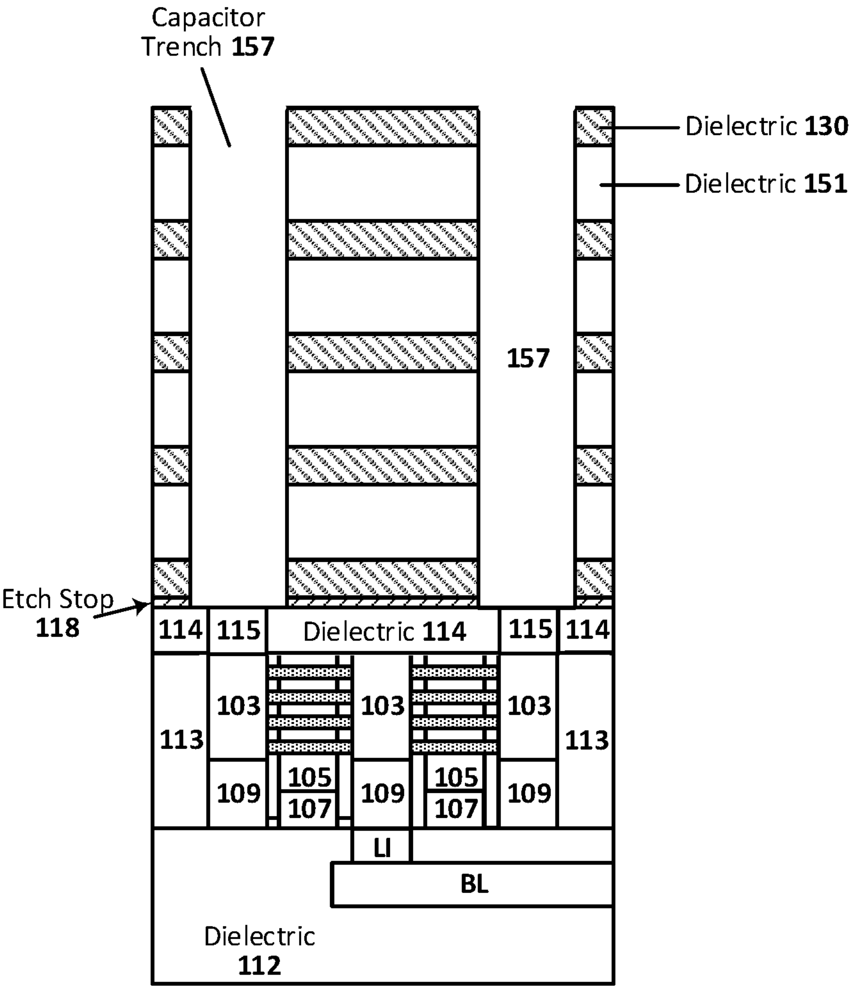
Figure 8C:
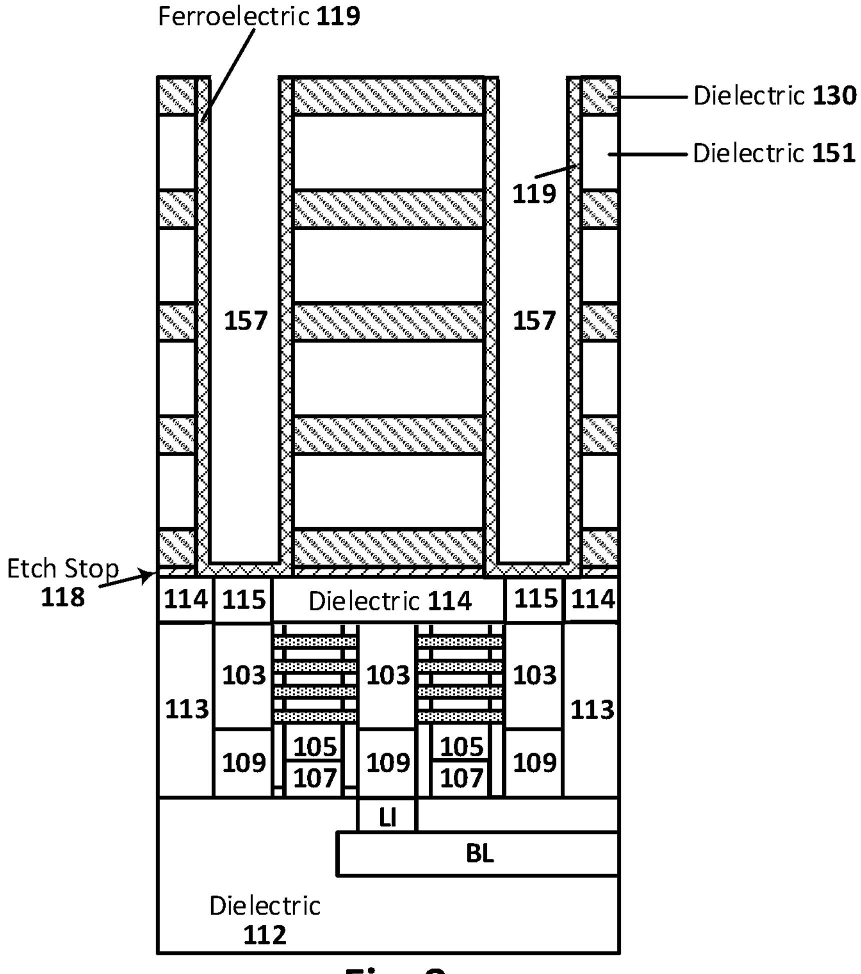
Figure 8D:
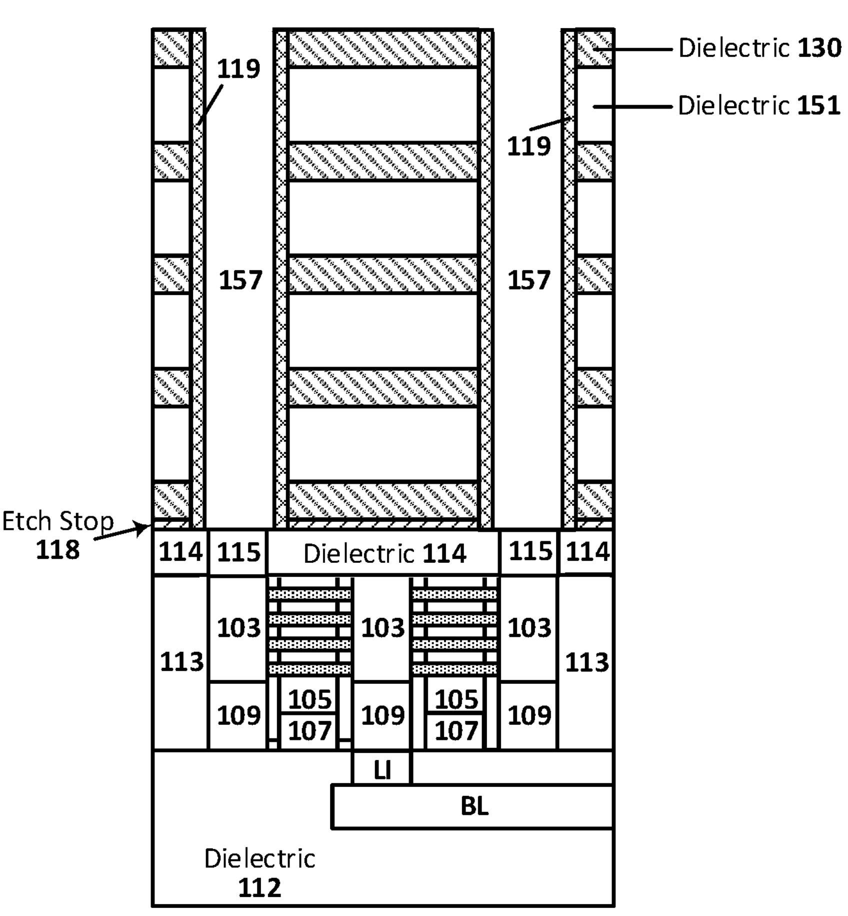
Figure 8E:
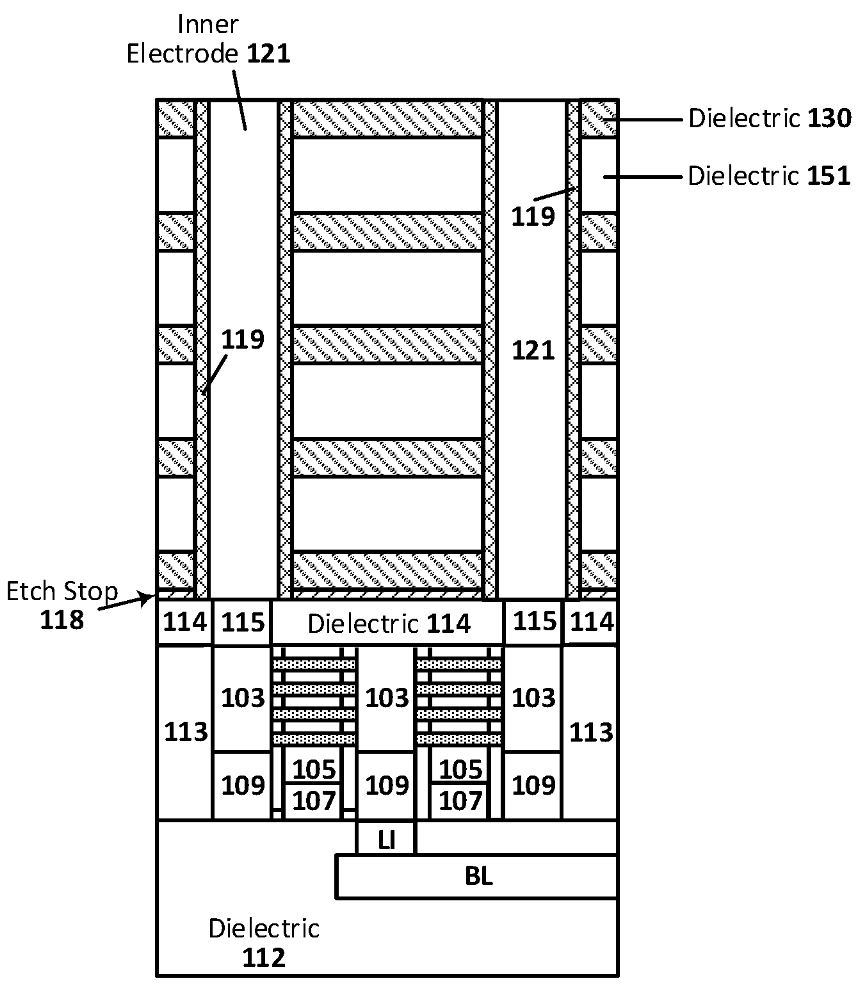
Figure 8F:
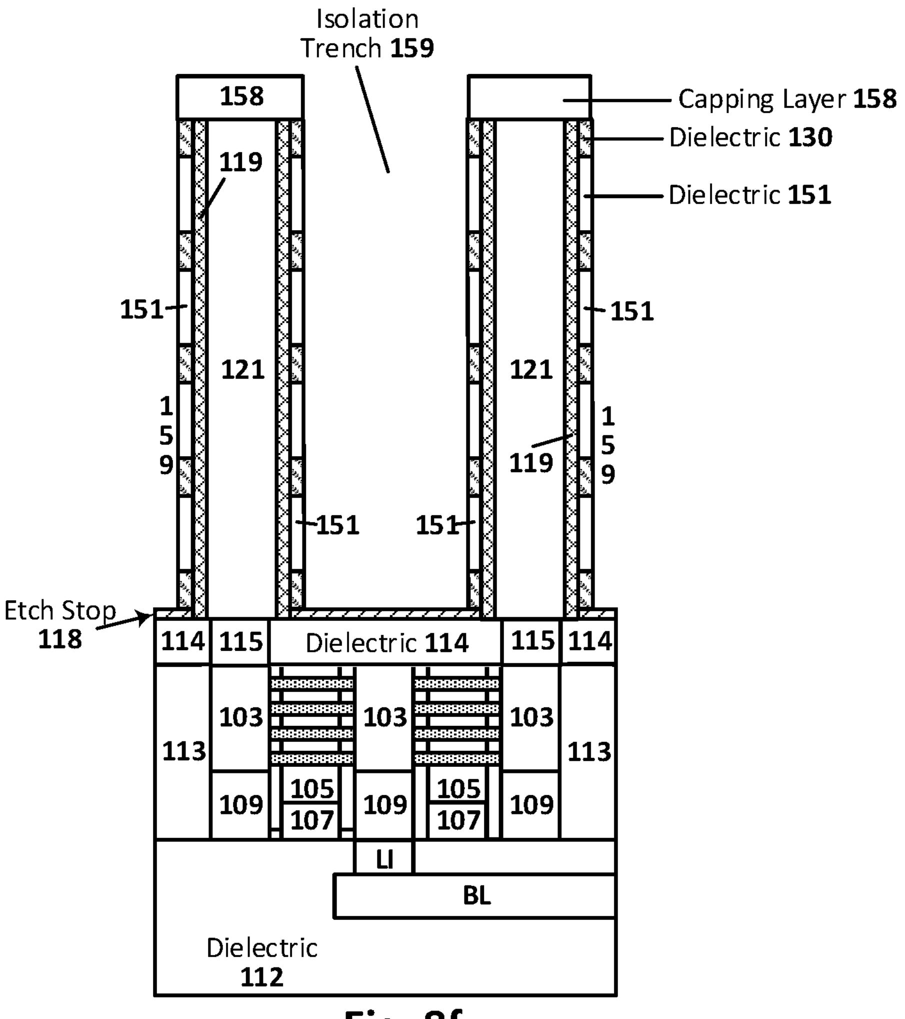

FIG. 8*b* shows an example of the structure of FIG. 8*a* after capacitor trenches 157 have been etched into the stack of alternating layers. The above relevant discussion with respect to other capacitor trenches (e.g., 148, 152) is equally applicable here. FIG. 8*c* shows an example of the structure of FIG. 8*b* after ferroelectric layer 119 has been deposited into each of the capacitor trenches 157 (such as described above with respect to FIG. 6*c*), and FIG. 8*d* shows an example of the structure of FIG. 8*c* after the ferroelectric layer 119 has directionally etched to remove horizontal portion along the underlying surface of the backside contact 115 (such as described above with respect to FIG. 6*d*). FIG. 8*e* shows an example of the structure of FIG. 8*d* after an inner electrode 121 has been deposited onto the ferroelectric layer 119 and underlying backside contact 115 (such as described above with respect to FIG. 6*e*). FIG. 8*f* shows an example of the structure of FIG. 8*e* after capping layer 158 has been patterned and isolation trenches 159 have been etched (such as described above with respect to FIG. 6*f*).

Figure 8G:
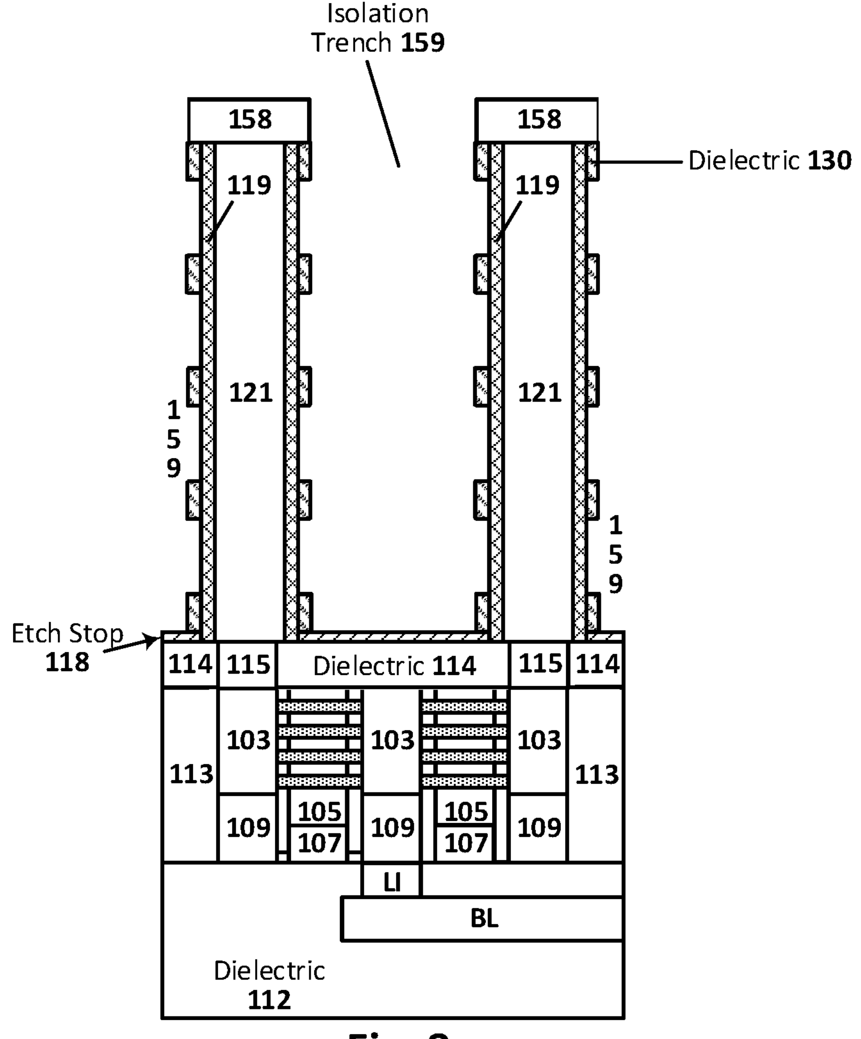
Figure 8H:
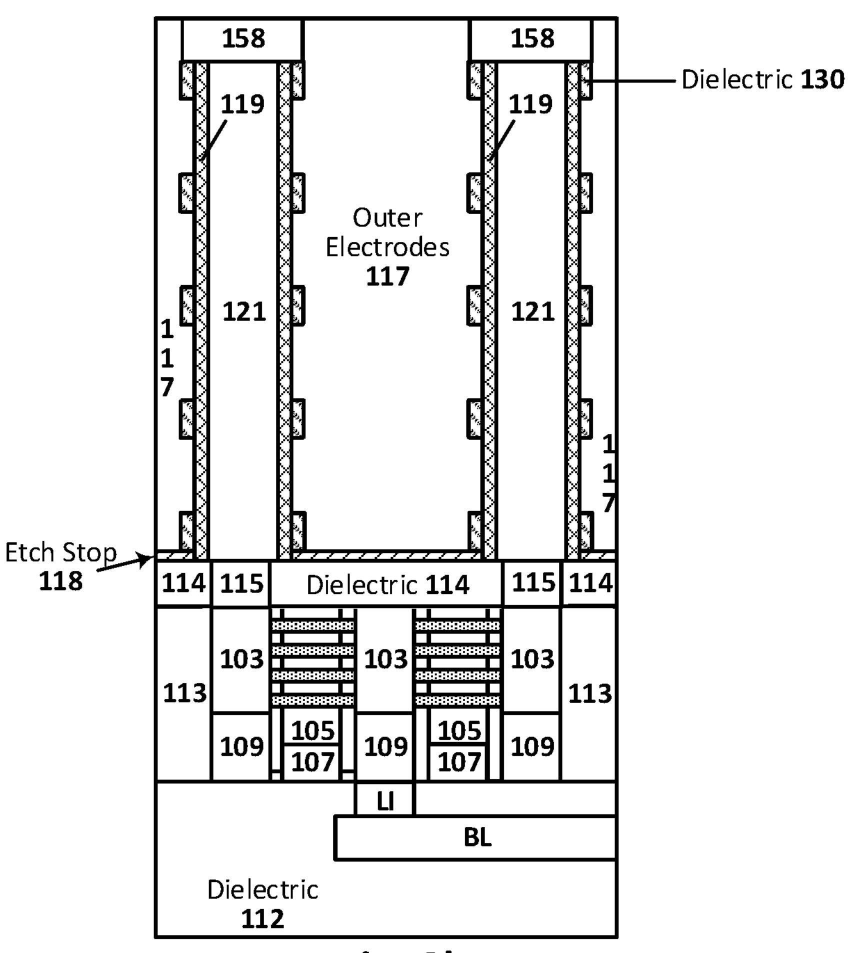
Figure 8I:
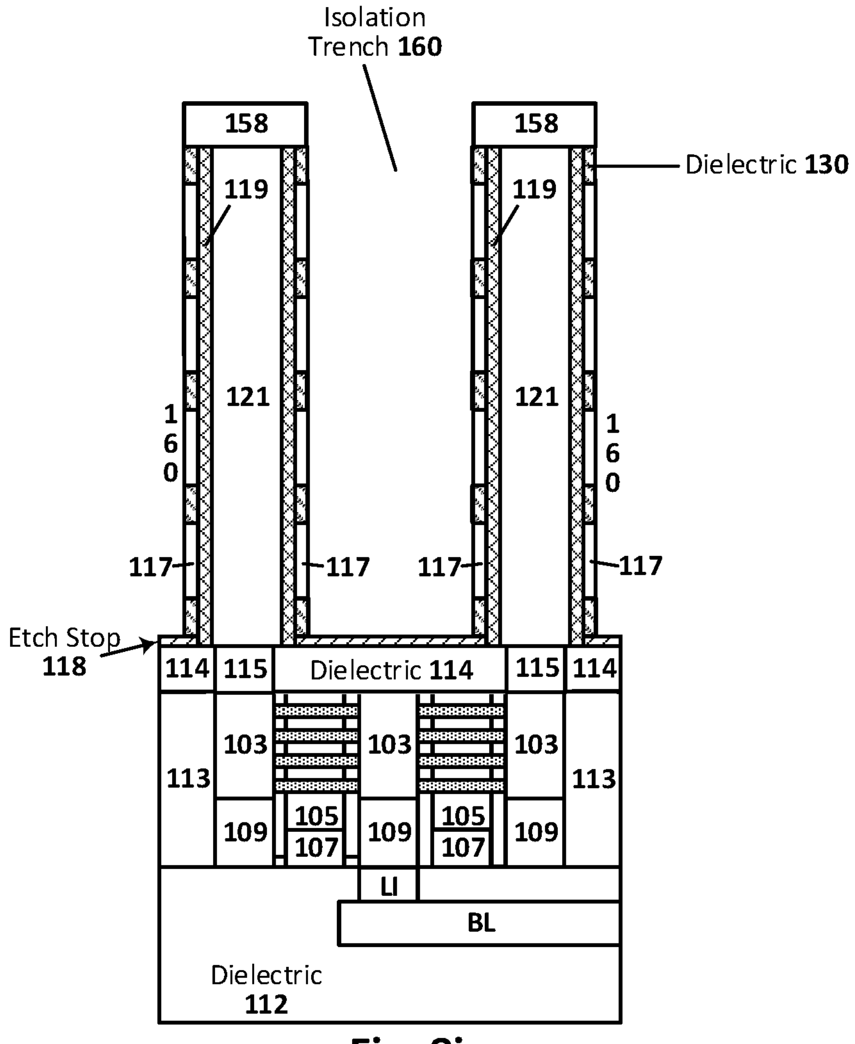
Figure 8J:
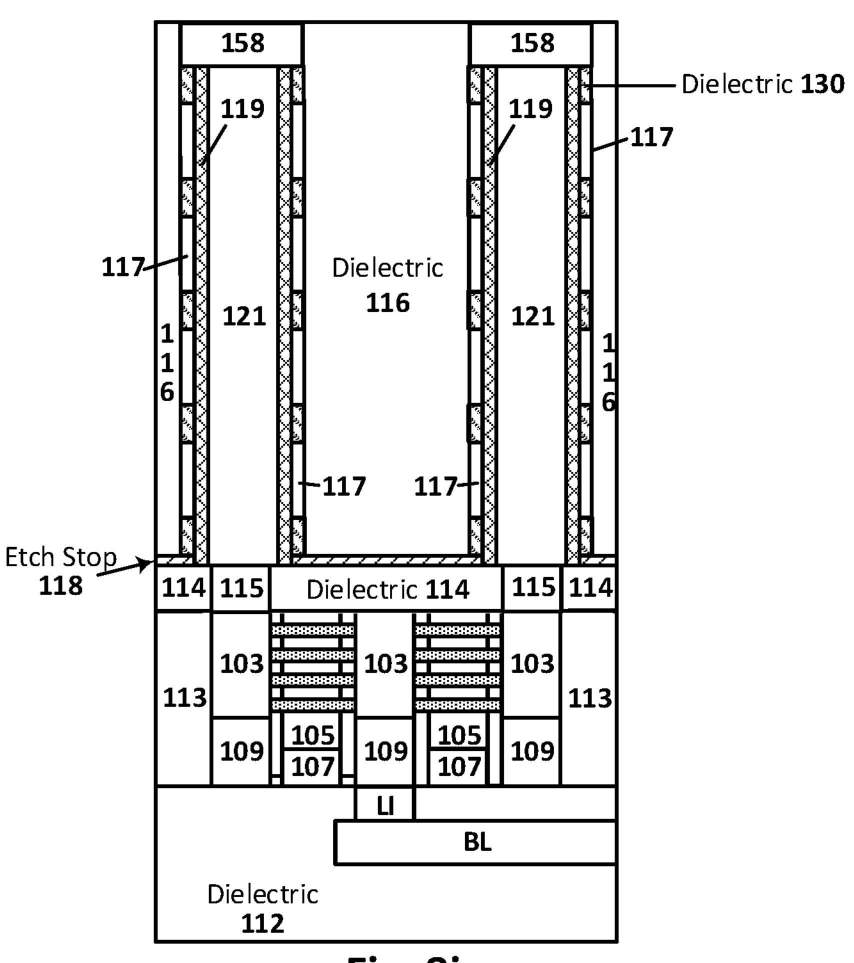

FIG. 8*g* shows an example of the structure of FIG. 8*f* after dielectric layers 151 have been removed by way of an isotropic etch that is selective to dielectric layers 130, and other exposed materials such as capping layer 153, inner electrode 121, and etch stop 118. FIG. 8*h* shows an example of the structure of FIG. 8*g* after an outer electrode 117 has been deposited to temporarily fill isolation trenches 159. Any excess deposition of electrode material on the upper surface of the structure can be removed, for example, via a CMP process. In this example, planarization stops on the capping layer 153. FIG. 8*i* shows an example of the structure of FIG. 8*h* after isolation trenches 160 have been etched. In this example, the isolation trenches 160 land on the etch stop layer 118. FIG. 8*j* shows an example of the structure of FIG. 8*i* after dielectric 116 has been deposited and planarized.

Once the 1T-4F capacitor structures are formed, the next interconnect layer can be formed, such as discussed with respect to FIGS. 2*a-b*. In one example case, the a dual damascene process is used to connect to the inner electrode 121 to a conductive line (e.g., line 123) by way of a via (e.g., via 122). In this example, the processing for the next interconnect layer may include a CMP process to planarize the structure down to the bottom of the inner electrodes 121, so as to remove capping layer 158. Further recall that different sections of the interconnect structure can be processed at different times. For instance, the memory section can be processed while the logic section is masked off, and vice-versa.

Example System

Figure 9:
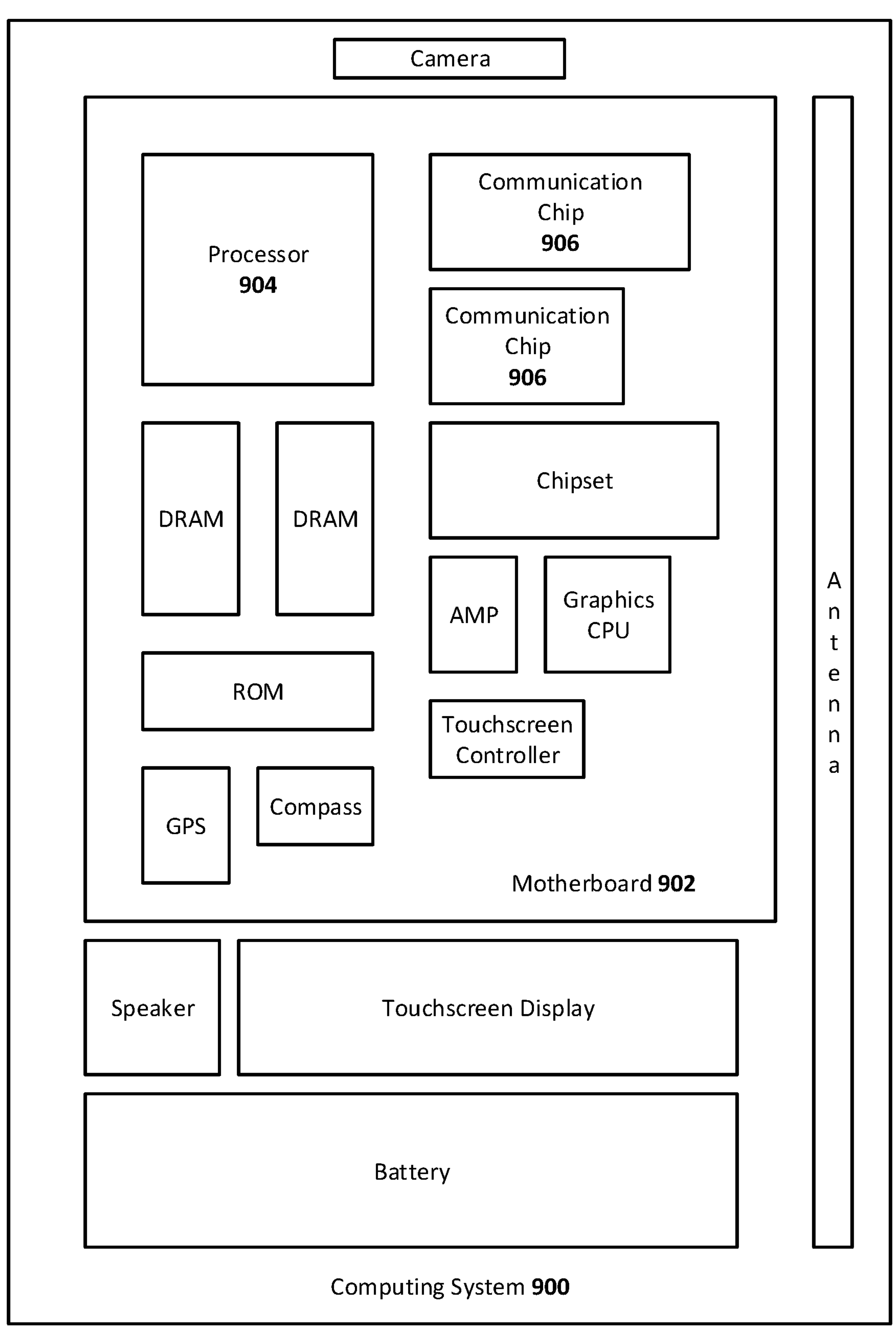
FIG. 9 is an example computing system implemented with one or more integrated circuit structures configured in accordance with an embodiment of the present disclosure.

FIG. 9 is an example computing system implemented with one or more integrated circuit structures configured in accordance with an embodiment of the present disclosure. As can be seen, computing system 900 houses a motherboard 902.

Motherboard 902 may include a number of components, including, but not limited to, a processor 904 and at least one communication chip 906, each of which can be physically and electrically coupled to motherboard 902, or otherwise integrated therein. As will be appreciated, motherboard 902 may be, for example, any printed circuit board, whether a main board, a daughterboard mounted on a main board, or the only board of system 900, etc.

Depending on its applications, computing system 900 may include one or more other components that may or may not be physically and electrically coupled to motherboard 902. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 900 may include one or more integrated circuit structures or devices configured in accordance with an example embodiment of the present disclosure (e.g., a backside ferroelectric capacitor, as variously described herein). In some embodiments, multiple functions can be integrated into one or more chips (e.g., for instance, note that communication chip 906 can be part of or otherwise integrated into processor 904).

Communication chip 906 enables wireless communications for the transfer of data to and from computing system 900. The term wireless and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 906 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1× evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. Computing system 900 may include multiple communication chips 906. For instance, a first communication chip 906 may be dedicated to shorter range wireless communications such as Wi-Fi and Bluetooth, and a second communication chip 906 may be dedicated to longer range wireless communications such as GPS, EDGE, GPRS, CDMA, WiMAX, LTE, Ev-DO, and others. In some embodiments, communication chip 906 may include one or more backside ferroelectric capacitors as variously described herein.

Processor 904 of computing system 900 includes an integrated circuit die packaged within processor 904. In some embodiments, the integrated circuit die of the processor includes onboard circuitry that is implemented with one or more integrated circuit structures or devices formed using techniques as variously described herein (e.g., backside ferroelectric capacitor). The term processor may refer to any device or portion of a device that processes, for instance, electronic data from registers and/or memory to transform that electronic data into other electronic data that may be stored in registers and/or memory.

Communication chip 906 also may include an integrated circuit die packaged within communication chip 906. In accordance with some such example embodiments, the integrated circuit die of the communication chip includes one or more integrated circuit structures or devices formed using techniques as variously described herein (e.g., backside ferroelectric capacitor). As will be appreciated in light of this disclosure, note that multi-standard wireless capability may be integrated directly into processor 904 (e.g., where functionality of any chips 906 is integrated into processor 904, rather than having separate communication chips). Further note that processor 904 may be a chipset having such wireless capability. In short, any number of processors 904 and/or communication chips 906 can be used. Likewise, any one chip or chipset can have multiple functions integrated therein.

In various implementations, computing system 900 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using techniques as variously described herein.

FURTHER EXAMPLE EMBODIMENTS

The following examples pertain to further embodiments, from which numerous permutations and configurations will be apparent.

Example 1 includes an integrated circuit including: a device layer including a transistor; a frontside interconnect structure above the device layer and having a conductive interconnect feature connected to a first terminal of the transistor; and a backside interconnect structure below the device layer and having a ferroelectric capacitor connected to a second terminal of the transistor.

Example 2 includes the integrated circuit of Example 1, wherein the backside interconnect structure includes first and second interconnect layers, with a first etch stop between the device layer and the first interconnect layer, and a second etch stop at least partially between the first and second interconnect layers, and the ferroelectric capacitor has a height equal to or greater than the vertical distance between the first and second etch stops.

Example 3 includes the integrated circuit of Example 1 or 2, wherein the ferroelectric capacitor comprises: an inner electrode connected to an interconnect feature in an interconnect layer below the ferroelectric capacitor; an outer electrode connected to the second terminal of the transistor; and a layer of ferroelectric material between the inner and outer electrodes.

Example 4 includes the integrated circuit of Example 1 or 2, wherein the ferroelectric capacitor comprises: an inner electrode connected to the second terminal of the transistor; an outer electrode connected to an interconnect feature in an interconnect layer that is below the ferroelectric capacitor or includes at least part of the ferroelectric capacitor; and a layer of ferroelectric material between the inner and outer electrodes.

Example 5 includes the integrated circuit of Example 4, wherein the ferroelectric capacitor is a multi-plate capacitor in which the outer conductor is one of a plurality of plate line conductors arranged in a staircase structure.

Example 6 includes the integrated circuit of Example 4 or 5, wherein the backside interconnect structure includes first and second interconnect layers, with a first etch stop between the device layer and the first interconnect layer, a second etch stop at least partially between the first and second interconnect layers, and a third etch stop below the second interconnect layer, and the ferroelectric capacitor has a height greater than the vertical distance between the first and second etch stops and up to the vertical distance between the first and third etch stops.

Example 7 includes the integrated circuit of any one Examples 1 through 6, wherein the transistor comprises: a body of semiconductor material extending from a source region to a drain region; a gate structure over the semiconductor material between the source and drain regions; a contact on a bottom surface of the source or drain region; and wherein an electrode of the ferroelectric capacitor is coupled to the source or drain region by the contact.

Example 8 includes the integrated circuit of any one Examples 1 through 7, wherein the second terminal of the transistor includes a backside contact that is below and in contact with a source or drain region of the transistor, and an electrode of the ferroelectric capacitor is in contact with the backside contact.

Example 9 includes the integrated circuit of Example 8, wherein the backside contact is self-aligned with the source or drain region which it is below. In some such cases, sidewalls of the source or drain region are aligned or co-linear with sidewalls of the backside contact.

Example 10 is a non-volatile memory device comprising the integrated circuit of any one Examples 1 through 9.

Example 11 is an integrated circuit memory cell, comprising: an access transistor including a body of semiconductor material extending from a source region to a drain region, and a backside contact extending downward from a bottom surface of the source or drain region; and a capacitor including a layer of ferroelectric material between first and second electrodes, the backside contact on the first electrode, and the second electrode in contact with a backside interconnect feature.

Example 12 includes the integrated circuit memory cell of Example 11, wherein the capacitor has a height that extends at least one interconnect layer.

Example 13 includes the integrated circuit memory cell of Example 11 or 12, wherein the capacitor is a multi-plate capacitor in which the second conductor is one of a plurality of plate line conductors configured in a staircase structure.

Example 14 includes the integrated circuit memory cell of any one of Examples 11 through 13, wherein the backside contact is self-aligned with the source or drain region which it is below.

Example 15 includes the integrated circuit memory cell of any one of Examples 11 through 14, wherein the layer of ferroelectric material is configured to isolate the backside interconnect feature from the first electrode.

Example 16 includes the integrated circuit memory cell of any one of Examples 11 through 15, wherein the layer of ferroelectric material extends between the backside interconnect feature and the first electrode.

Example 17 is a non-volatile memory device comprising the integrated circuit memory cell of any one of Examples 11 through 16.

Example 18 is an integrated circuit capacitor structure, comprising: a first electrode connected to a transistor terminal by a backside contact, the backside contact extending downward from a bottom surface of the transistor terminal to the first electrode; a second electrode connected to an interconnect feature in an interconnect layer that is below the capacitor or includes at least part of the capacitor; and a layer of ferroelectric material between the first and second electrodes.

Example 19 includes the integrated circuit capacitor structure of Example 18, wherein the first electrode includes a layer of conductive material on a bottom surface of the backside contact and sidewalls of a trench extending downward from the backside contact, and the layer of ferroelectric material is on the layer of conductive material, and the second electrode includes a body of conductive material on the layer of ferroelectric material.

Example 20 includes the integrated circuit capacitor structure of Example 18 or 19, wherein the first electrode includes a body of conductive material extending downward from the backside contact, and the layer of ferroelectric material is on sidewalls of the first electrode, and the second electrode extends laterally outward from the layer of ferroelectric material.

Example 21 includes the integrated circuit capacitor structure of Example 20, wherein the capacitor is a multi-plate capacitor in which the second conductor is one of a plurality of plate line conductors arranged in a staircase structure.

Example 22 includes the integrated circuit capacitor structure of any one of Examples 18 through 21, wherein the capacitor has a height that extends through at least one interconnect layer.

Example 23 includes the integrated circuit capacitor structure of any one of Examples 18 through 22, wherein the transistor terminal is a source or drain region, and the backside contact is self-aligned with the source or drain region.

Example 24 is a non-volatile memory device comprising the integrated circuit capacitor structure of any one of Examples 18 through 23.

Example 25 is a processor comprising the integrated circuit capacitor structure of any one of Examples 18 through 23.

Example 26 is an integrated circuit comprising the integrated circuit capacitor structure of any one of Examples 18 through 23, or the non-volatile memory device of Example 24, or the processor of Example 25.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit comprising:

a device layer including a transistor;

a frontside interconnect structure above the device layer and having a conductive interconnect feature connected to a first terminal of the transistor; and a backside interconnect structure below the device layer and having a ferroelectric capacitor connected to a second terminal of the transistor, wherein the backside interconnect structure includes first and second interconnect layers, with a first etch stop between the device layer and the first interconnect layer, and a second etch stop at least partially between the first and second interconnect layers, and the ferroelectric capacitor has a height equal to or greater than the vertical distance between the first and second etch stops.

2. The integrated circuit of claim 1, wherein the ferroelectric capacitor comprises:

an inner electrode connected to an interconnect feature in an interconnect layer below the ferroelectric capacitor;

an outer electrode connected to the second terminal of the transistor; and a layer of ferroelectric material between the inner and outer electrodes.

3. The integrated circuit of claim 1, wherein the ferroelectric capacitor comprises:

an inner electrode connected to the second terminal of the transistor;

an outer electrode connected to an interconnect feature in an interconnect layer that is below the ferroelectric capacitor or includes at least part of the ferroelectric capacitor; and a layer of ferroelectric material between the inner and outer electrodes.

4. The integrated circuit of claim 3, wherein the ferroelectric capacitor is a multi-plate capacitor in which the outer conductor is one of a plurality of plate line conductors arranged in a staircase structure.

5. The integrated circuit of claim 3, wherein the backside interconnect structure includes a third etch stop below the second interconnect layer, and the ferroelectric capacitor has a height greater than the vertical distance between the first and second etch stops and up to the vertical distance between the first and third etch stops.

6. The integrated circuit of claim 1, wherein the transistor comprises:

a body of semiconductor material extending from a source region to a drain region;

a gate structure over the semiconductor material between the source and drain regions;

a contact on a bottom surface of the source or drain region; and wherein an electrode of the ferroelectric capacitor is coupled to the source or drain region by the contact.

7. The integrated circuit of claim 1, wherein the second terminal of the transistor includes a backside contact that is below and in contact with a source or drain region of the transistor, and an electrode of the ferroelectric capacitor is in contact with the backside contact.

8. The integrated circuit of claim 7, wherein the backside contact is self-aligned below the source or drain region.

9. The integrated circuit of claim 1, wherein the ferroelectric capacitor includes a first electrode, a layer of ferroelectric material, and a second electrode, wherein the first electrode includes a layer of conductive material on a bottom surface of the second terminal and sidewalls of a trench extending downward from the second terminal, and the layer of ferroelectric material is on the layer of conductive material, and the second electrode includes a body of conductive material on the layer of ferroelectric material.

10. An integrated circuit memory cell, comprising:

an access transistor including a body of semiconductor material extending from a source region to a drain region, and a backside contact extending downward from a bottom surface of the source or drain region; and a capacitor including a layer of ferroelectric material between first and second electrodes, the backside contact on the first electrode, and the second electrode in contact with a backside interconnect feature, wherein the capacitor has a height that extends at least one interconnect layer.

11. The integrated circuit memory cell of claim 10, wherein the backside contact is self-aligned below the source or drain region.

12. The integrated circuit memory cell of claim 10, wherein the layer of ferroelectric material is configured to isolate the backside interconnect feature from the first electrode.

13. The integrated circuit memory cell of claim 10, wherein the layer of ferroelectric material extends between the backside interconnect feature and the first electrode.

14. An integrated circuit memory cell, comprising:

an access transistor including a body of semiconductor material extending from a source region to a drain region, and a backside contact extending downward from a bottom surface of the source or drain region; and a capacitor including a layer of ferroelectric material between first and second electrodes, the backside contact on the first electrode, and the second electrode in contact with a backside interconnect feature, wherein the capacitor is a multi-plate capacitor in which the second electrode is one of a plurality of plate line conductors electrodes configured in a staircase structure.

15. The integrated circuit memory cell of claim 14, wherein the layer of ferroelectric material is configured to isolate the backside interconnect feature from the first electrode.

16. The integrated circuit memory cell of claim 14, wherein the capacitor has a height that extends at least one interconnect layer beneath the backside contact.

17. An integrated circuit capacitor structure, comprising:

a first electrode connected to a transistor terminal by a backside contact, the backside contact extending downward from a bottom surface of the transistor terminal to the first electrode;

a second electrode connected to an interconnect feature in an interconnect layer that is below the capacitor or includes at least part of the capacitor; and a layer of ferroelectric material between the first and second electrodes, wherein the first electrode includes a body of conductive material extending downward from the backside contact, and the layer of ferroelectric material is on sidewalls of the first electrode, and the second electrode extends laterally outward from the layer of ferroelectric material, wherein the second electrode is one of a plurality of plate line electrodes arranged in a staircase structure.

18. The integrated circuit capacitor structure of claim 17, wherein the transistor terminal is a source or drain region, and the backside contact is self-aligned with the source or drain region.

19. An integrated circuit capacitor, comprising:

a first electrode connected to a transistor terminal by a backside contact, the backside contact extending downward from a bottom surface of the transistor terminal to the first electrode;

a second electrode connected to an interconnect feature in an interconnect layer that is below the capacitor or includes at least part of the capacitor; and a layer of ferroelectric material between the first and second electrodes, wherein the capacitor has a height that extends through at least one interconnect layer.

20. The integrated circuit capacitor of claim 19, wherein the layer of ferroelectric material is configured to isolate the interconnect feature from the first electrode.

* * * * *